US012772708B2

(12) United States Patent
Lee et al.

(10) Patent No.: US 12,772,708 B2
(45) Date of Patent: Oct. 20, 2026

(54) DISPLAY DEVICE

(71) Applicant: Samsung Display Co., Ltd., Yongin-si (KR)

(72) Inventors: Jin Hyeong Lee, Yongin-si (KR); Dae Won Kim, Yongin-si (KR); Jong Ho Son, Yongin-si (KR); Hye Beom Shin, Yongin-si (KR); Kyung Hee Lee, Yongin-si (KR); Sun Young Chang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 308 days.

(21) Appl. No.: 18/387,492

(22) Filed: Nov. 7, 2023

(65) Prior Publication Data

US 2024/0306477 A1 Sep. 12, 2024

(30) Foreign Application Priority Data

Mar. 7, 2023 (KR) ........................ 10-2023-0029965

(51) Int. Cl.
*H10K 59/80* (2023.01)
*G06F 3/041* (2006.01)
(Continued)

(52) U.S. Cl.
CPC ......... *H10K 59/879* (2023.02); *G06F 3/0412* (2013.01); *G06F 3/0443* (2019.05); (Continued)

(58) Field of Classification Search
None
See application file for complete search history.

(56) References Cited

U.S. PATENT DOCUMENTS 11,915,962 B2 2/2024 Du et al.
12,193,269 B2 1/2025 Ebisuno et al.
(Continued)

FOREIGN PATENT DOCUMENTS

CN 110265586 A 9/2019
CN 111969125 11/2020
(Continued)

OTHER PUBLICATIONS

Office Action issued in corresponding Korean application No. KR 10-2023-0029965 on Aug. 23, 2026.

*Primary Examiner* — Jay C Chang
(74) *Attorney, Agent, or Firm* — F. CHAU & ASSOCIATES, LLC

(57) ABSTRACT

A display device includes a substrate. A light emitting element layer is disposed on the substrate. The light emitting element layer includes a plurality of emission areas. Each of the emission areas comprises a light emitting element emitting light. A thin film encapsulation layer is on the light emitting element layer. The thin film encapsulation layer comprises a first inorganic encapsulation film, a first organic encapsulation film on the first inorganic encapsulation film, and a second inorganic encapsulation film on the first organic encapsulation film. A light control layer includes a first light blocking layer disposed on the thin film encapsulation layer and having a first opening, and a first light transmitting layer disposed on the first light blocking layer. The first light transmitting layer includes an organic layer. A refractive index of the first light transmitting layer is greater than a refractive index of the first organic encapsulation film.

20 Claims, 23 Drawing Sheets

(51) Int. Cl.

| | |
|---|---|
| ***G06F 3/044*** | (2006.01) |
| ***H10K 59/122*** | (2023.01) |
| ***H10K 59/40*** | (2023.01) |

(52) U.S. Cl.
CPC ......... *H10K 59/40* (2023.02); *H10K 59/8731* (2023.02); *H10K 59/122* (2023.02)

(56) References Cited

U.S. PATENT DOCUMENTS

| | | | | |
|---|---|---|---|---|
| 2020/0357871 | A1* | 11/2020 | Chung | H04N 23/57 |
| 2022/0069045 | A1* | 3/2022 | Ebisuno | H10K 59/1213 |
| 2022/0325047 | A1* | 10/2022 | Shibasaki | C08L 79/08 |
| 2025/0143082 | A1 | 5/2025 | Ebisuno et al. | |

FOREIGN PATENT DOCUMENTS

| | | |
|---|---|---|
| CN | 115084409 | 9/2022 |
| KR | 10-2020-0081911 | 7/2020 |
| KR | 10-2021-0084096 | 7/2021 |
| KR | 10-2022-0031795 A | 3/2022 |
| KR | 10-2023-0108766 | 7/2023 |

* cited by examiner

170 : 171, 172, 173

DISPLAY DEVICE

CROSS-REFERENCE TO RELATED APPLICATION

This application claims priority under 35 U.S.C. § 119 to Korean Patent Application No. 10-2023-0029965, filed on Mar. 7, 2023 in the Korean Intellectual Property Office, the disclosure of which is incorporated by reference in its entirety herein.

1. TECHNICAL FIELD

The present disclosure relates to a display device and a semiconductor device.

2. DISCUSSION OF RELATED ART

Display devices for displaying images are being applied to an increasingly wide array of electronic devices along with the advancement of the information-oriented society. A display device may be a flat panel display device, such as a liquid crystal display, a field emission display and a light emitting display. A light emitting display device may include an organic light emitting display device including an organic light emitting diode element as a light emitting element or a light emitting diode display device including an inorganic light emitting diode element such as a light emitting diode (LED) as a light emitting element.

In an embodiment in which a display device is applied to a vehicle display device, when the image displayed on the vehicle display device disposed in front of the driver or passenger is reflected on the windshield at night, it may interfere with the driver's driving. Therefore, the viewing angle of the image displayed on the vehicle display device should be controlled. In addition, the image displayed on the vehicle display device should be controlled so that the image displayed on the vehicle display device is disposed in front of the driver and is not provided to the passenger for privacy purposes.

SUMMARY

Aspects of the present disclosure provide a display device in which a front viewing angle is minimized.

Aspects of the present disclosure also provide a display device in which front light emission efficiency is increased.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a substrate. A light emitting element layer is disposed on the substrate. The light emitting element layer includes a plurality of emission areas. Each of the emission areas comprises a light emitting element emitting light. A thin film encapsulation layer is on the light emitting element layer. The thin film encapsulation layer comprises a first inorganic encapsulation film, a first organic encapsulation film on the first inorganic encapsulation film, and a second inorganic encapsulation film on the first organic encapsulation film. A light control layer includes a first light blocking layer disposed on the thin film encapsulation layer and having a first opening, and a first light transmitting layer disposed on the first light blocking layer. The first light transmitting layer includes an organic layer. A refractive index of the first light transmitting layer is greater than a refractive index of the first organic encapsulation film.

In an embodiment, the first light blocking layer contains an organic material that blocks light, and a refractive index of the first light blocking layer is less than a refractive index of the first light transmitting layer.

In an embodiment, a difference between the refractive index of the first light transmitting layer and the refractive index of the first light blocking layer is in a range of about 0.1 to about 0.15.

In an embodiment, the refractive index of the first light blocking layer is in a range of about 1.4 to about 1.55, and the refractive index of the first light transmitting layer is in a range of about 1.55 to about 1.7.

In an embodiment, the refractive index of the first light blocking layer is greater than the refractive index of the first organic encapsulation film.

In an embodiment, the light control layer further comprises, a second light blocking layer disposed on the first light transmitting layer and having a second opening, and a second light transmitting layer disposed on the second light blocking layer. The second light transmitting layer includes an organic layer. A refractive index of the second light transmitting layer is greater than the refractive index of the first organic encapsulation film.

In an embodiment, the second opening overlaps the first opening in a thickness direction of the substrate.

In an embodiment, a width of the first opening is greater than a width of the second opening.

In an embodiment, a width of the first opening is less than a width of the second opening.

In an embodiment, a thickness of the first light transmitting layer is different from a thickness of the second light transmitting layer.

In an embodiment, the display device further includes, a touch sensor layer disposed between the thin film encapsulation layer and the light control layer. The touch sensor layer comprises, a first touch insulating layer, a touch electrode disposed on the first touch insulating layer, and a second touch insulating layer disposed on the touch electrode. The refractive indices of the first touch insulating layer and the second touch insulating layer are greater than the refractive index of the first organic encapsulation film.

In an embodiment, the first touch insulating layer and the second touch insulating layer include an organic layer, and refractive indices of the first touch insulating layer and the second touch insulating layer are greater than or equal to a refractive index of the second inorganic encapsulation film.

In an embodiment, the touch sensor layer further comprises a planarization layer disposed on the second touch insulating layer, and a refractive index of the planarization layer is the same as the refractive index of the second touch insulating layer.

In an embodiment, the first touch insulating layer, the second touch insulating layer, the planarization layer, and the first light transmitting layer have a same refractive index as each other.

In an embodiment, the first touch insulating layer and the second touch insulating layer include an inorganic layer.

In an embodiment, an angle between a sidewall of the first opening and a horizontal direction within the first opening is in a range of about 90 degrees to about 110 degrees.

In an embodiment, the first opening overlaps the emission area in a thickness direction of the substrate.

According to an embodiment of the present disclosure, a display device includes a substrate. A light emitting element layer is disposed on the substrate. The light emitting element layer comprises a plurality of emission areas. Each of the plurality of emission areas comprises a light emitting element emitting light. A thin film encapsulation layer is disposed on the light emitting element layer. The thin film encapsulation layer comprises a first inorganic encapsulation film, a first organic encapsulation film disposed on the first inorganic encapsulation film, and a second inorganic encapsulation film disposed on the first organic encapsulation film. A light control layer comprises a first light blocking layer disposed on the thin film encapsulation layer and having a first opening, and a first light transmitting layer disposed on the first light blocking layer. A refractive index of the first light transmitting layer is greater than or equal to a refractive index of the second inorganic encapsulation film.

In an embodiment, the light control layer further comprises, a second light blocking layer disposed on the first light transmitting layer and having a second opening, and a second light transmitting layer disposed on the second light blocking layer. A refractive index of the second light transmitting layer is greater than or equal to the refractive index of the second inorganic encapsulation film.

In an embodiment, the display device further includes, a touch sensor layer disposed between the thin film encapsulation layer and the light control layer. The touch sensor layer comprises, a first touch insulating layer, a touch electrode disposed on the first touch insulating layer, and a second touch insulating layer disposed on the touch electrode. The refractive indices of the first touch insulating layer and the second touch insulating layer are greater than or equal to the refractive index of the second inorganic encapsulation film.

According to the display device according to an embodiment of the present disclosure, the front viewing angle may be minimized.

According to the display device according to an embodiment of the present disclosure, the front light emission efficiency may be increased.

However, effects according to the embodiments of the present disclosure are not limited to those described above and various other effects are incorporated herein.

BRIEF DESCRIPTION OF THE DRAWINGS

The above and other aspects and features of the present disclosure will become more apparent by describing in detail non-limiting embodiments thereof with reference to the attached drawings, in which.

DETAILED DESCRIPTION OF EMBODIMENTS

The present disclosure will now be described more fully hereinafter with reference to the accompanying drawings, in which non-limiting embodiments of the present disclosure are shown. The present disclosure may, however, be embodied in different forms and should not be construed as limited to the described embodiments set forth herein.

It will also be understood that when a layer is referred to as being "on" another layer or substrate, it can be directly on the other layer or substrate, or intervening layers may also be present. When a layer is referred to as being "directly on" another layer or substrate, no intervening layers may be present. The same reference numbers indicate the same components throughout the specification.

Hereinafter, embodiments of the present disclosure will be described with reference to the accompanying drawings.

Figure 1:
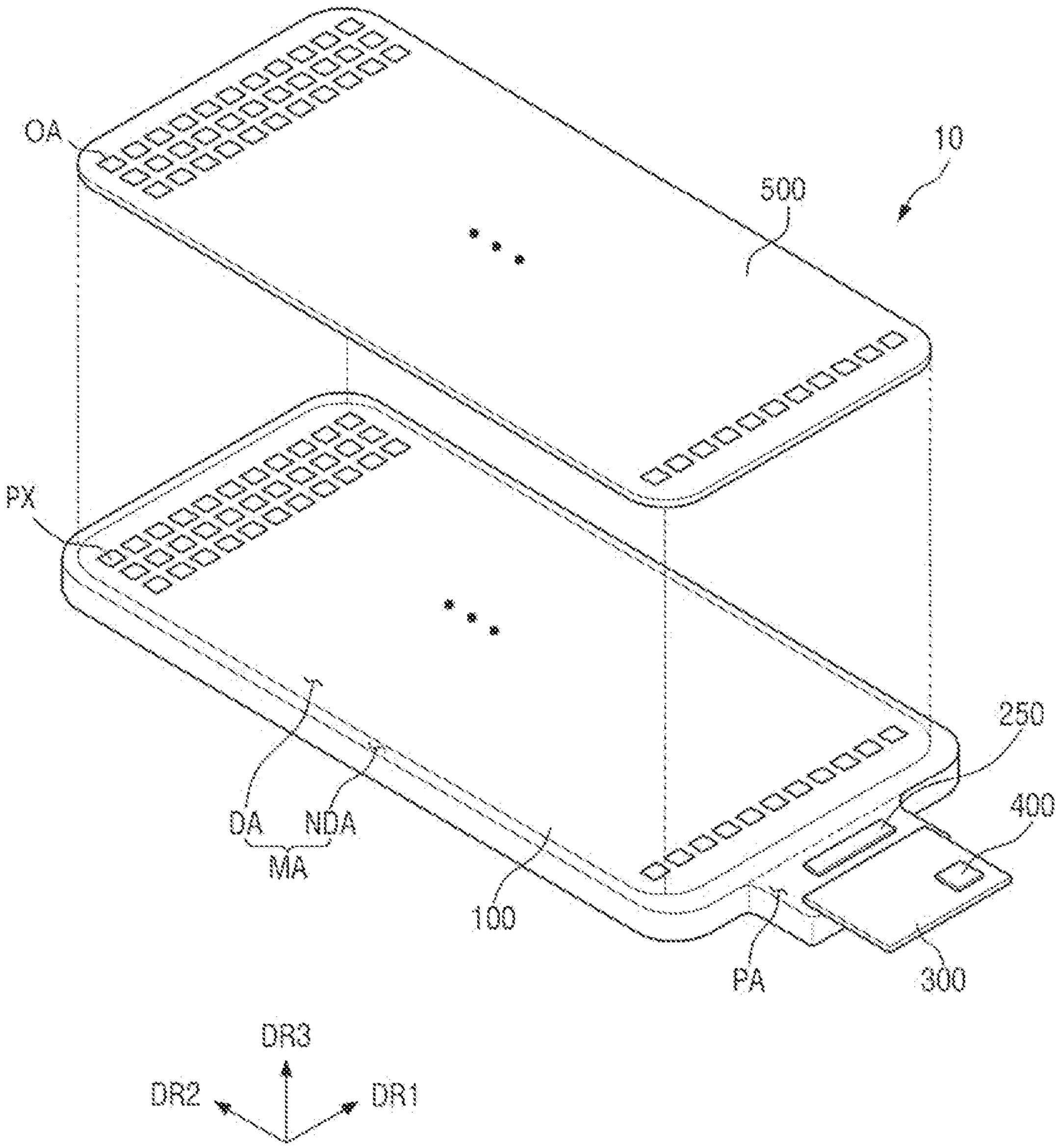
FIG. 1 is an exploded perspective view of a display device according to an embodiment of the present disclosure.
Figure 2:
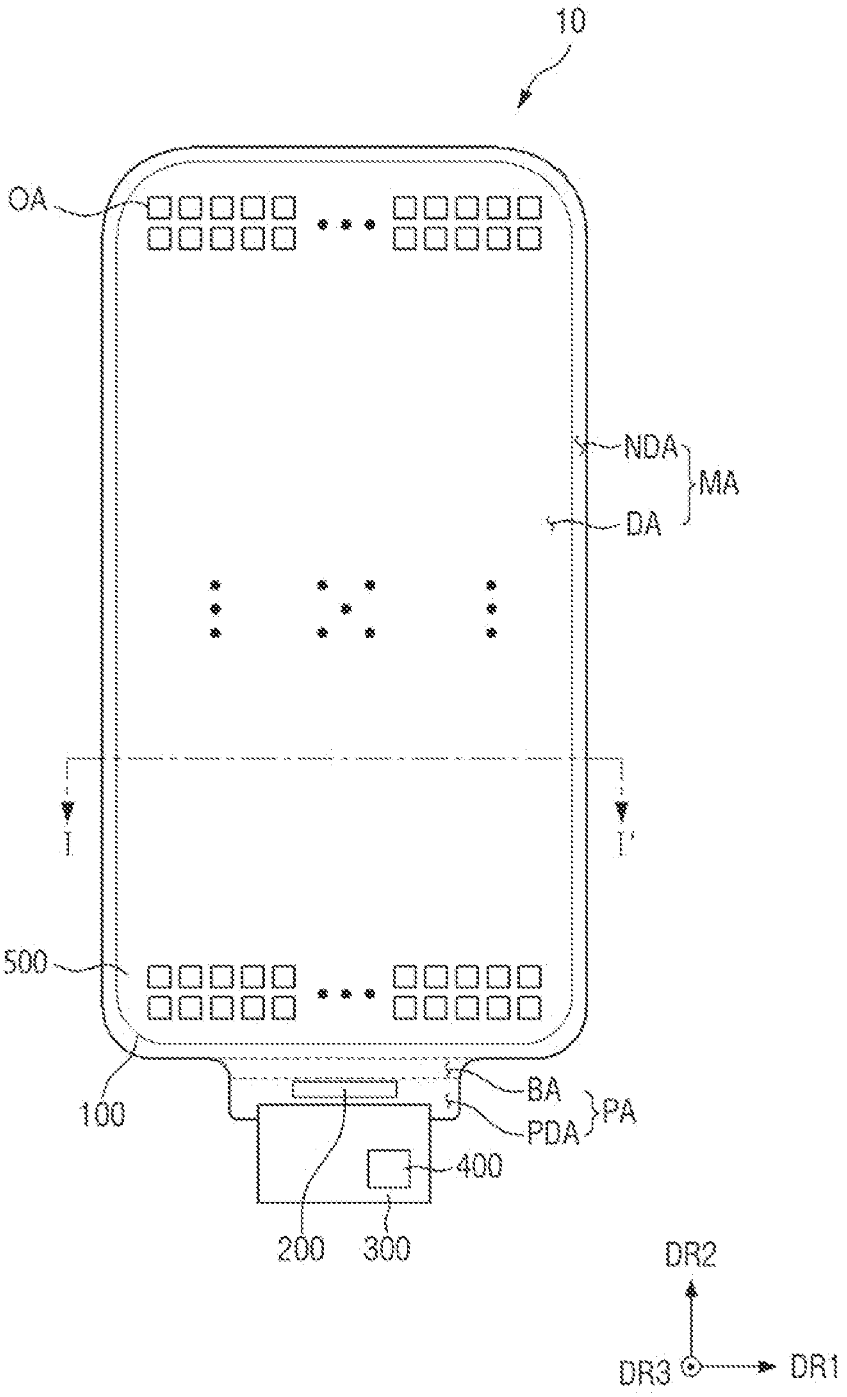
FIG. 2 is a plan view of a display device according to an embodiment of the present disclosure.

FIG. 1 is an exploded perspective view of a display device according to an embodiment. FIG. 2 is a plan view of a display device according to an embodiment.

Referring to FIGS. 1 and 2, a display device 10 is a device for displaying one or more moving or still images. In an embodiment, the display device 10 may be used as a display screen that is applied to various electronic devices, such as a television, a laptop computer, a monitor, a billboard and an Internet-of-Things (IoT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC). The display device 10 may be any one of an organic light emitting display device, a liquid crystal display device, a plasma display device, a field emission display device, an electrophoretic display device, an electrowetting display device, a quantum dot light emitting display device, a micro LED display device, and the like. In the following description, the display device 10 is described as an organic light emitting display device for convenience of explanation. However, embodiments of the present disclosure are not necessarily limited thereto.

The display device 10 according to an embodiment may include a display panel 100, a display driving circuit 250, a circuit board 300, a touch driving circuit 400, and a light control layer 500.

In an embodiment, the display panel 100 may include a plurality of pixels PX arranged in a first direction DR1 and a second direction DR2. Each of the pixels PX may have a rectangular, square, or rhombic shape in a plan view (e.g., in a plane defined in the first and second directions DR1, DR2). For example, as shown in the drawing, each of the pixels PX may have a square shape in plan view. However, embodiments of the present disclosure are not necessarily limited thereto, and the pixels PX may have various shapes such as a polygon, a circle, and an ellipse in a plan view.

In the illustrated figure, the first direction DR1 and the second direction DR2 cross each other as horizontal directions. For example, the first direction DR1 and the second direction DR2 may be orthogonal to each other. In addition, the third direction DR3 crosses the first direction DR1 and the second direction DR2, and may be, for example, perpendicular directions orthogonal to each other. However, embodiments of the present disclosure are not necessarily limited thereto and the first to third directions DR1 to DR3 may cross each other at various different angles.

The display panel 100 may include a main area MA and a protrusion area PA protruding from one side of the main area MA.

In an embodiment, the main area MA may, in a plan view, be formed in a rectangular shape having relatively short sides in a first direction DR1 and relatively long sides in a second direction DR2 crossing the first direction DR1. However, embodiments of the present disclosure are not necessarily limited thereto. In an embodiment, the corner where the short side in the first direction DR1 and the long side in the second direction DR2 meet each other may be rounded to have a predetermined curvature or may be right-angled. The planar shape of the display device 10 is not necessarily limited to a quadrilateral shape, and may be formed in another polygonal shape, a circular shape, or an elliptical shape. The main area MA may be formed flat. However, embodiments of the present disclosure are not necessarily limited thereto, and the main area MA may include curved portions formed at left and right ends. In this embodiment, the curved portions may have a constant curvature or a changing curvature.

The main area MA may include a display area DA where pixels are formed to display an image and a non-display area NDA which is a peripheral area of the display area DA where pixels may not be formed.

In the display area DA, in addition to the pixels, scan lines, data lines, and power lines connected to the pixels may be disposed in the display area DA. In an embodiment in which the main area MA includes a curved portion, the display area DA may be disposed on the curved portion. In this embodiment, the image of the display panel 100 may also be seen on the curved portion.

The non-display area NDA may be defined as an area from the boundary of the display area DA to the edge of the display panel 100. In an embodiment, a scan driver for applying scan signals to the scan lines and link lines connecting the data lines to the display driving circuit 250 may be disposed in the non-display area NDA.

The protruding area PA may protrude from one side of the main area MA. For example, the protruding area PA may protrude from the lower side of the main area MA (e.g., in the second direction DR2) as shown in FIG. 2. However, embodiments of the present disclosure are not necessarily limited thereto. A length of the protruding area PA in the first direction DR1 may be smaller than a length of the main area MA in the first direction DR1.

In an embodiment as shown in FIG. 2, the protruding area PA may include a bending area BA and a pad area PDA. In this embodiment, the pad area PDA may be disposed on one side of the bending area BA, and the main area MA may be disposed on the other side of the bending area BA. For example, the pad area PDA may be disposed below the bending area BA (e.g., in the second direction DR2), and the main area MA may be disposed above the bending area BA (e.g., in the second direction DR2).

In an embodiment, the display panel 100 may be formed flexibly such that it can be curved, bent, folded, or rolled. Accordingly, the display panel 100 may be bent in the thickness direction, such as in the third direction DR3 in the bending area BA. In this embodiment, one surface of the pad area PDA of the display panel 100 faces upward before the display panel 100 is bent, but after the display panel 100 is bent, one surface of the pad area PDA of the display panel 100 faces downward. Accordingly, since the pad area PDA is disposed below the main area MA, the pad area PDA may overlap the main area MA.

Pads electrically connected to the display driving circuit 250 and the circuit board 300 may be disposed in the pad area PDA of the display panel 100.

The display driving circuit 250 outputs signals and voltages for driving the display panel 100. For example, the display driving circuit 250 may supply data voltages to data lines. Further, the display driving circuit 250 may supply a power voltage to the power line, and may supply scan control signals to the scan driver. In an embodiment, the display driving circuit 250 may be formed as an integrated circuit (IC) and mounted on the display panel 100 in the pad area PDA by a chip on glass (COG) method, a chip on plastic (COP) method, or an ultrasonic bonding method. However, embodiments of the present disclosure are not necessarily limited thereto. For example, in an embodiment the display driving circuit 250 may be mounted on the circuit board 300.

The pads may include display pads electrically connected to the display driving circuit 250 and touch pads electrically connected to touch lines.

In an embodiment, the circuit board 300 may be attached onto the pads using an anisotropic conductive film. Accordingly, lead lines of the circuit board 300 may be electrically connected to the pads. In an embodiment, the circuit board 300 may be a flexible printed circuit board, a printed circuit board, or a flexible film such as a chip on film.

The touch driving circuit 400 may be connected to touch electrodes of a touch sensor layer TSU (see FIG. 3) of the display panel 100. The touch driving circuit 400 applies driving signals to the touch electrodes of the touch sensor layer TSU (see FIG. 3) and measures capacitance values of the touch electrodes. The driving signal may be a signal having a plurality of driving pulses. The touch driving circuit 400 may determine whether or not touch is inputted based on the capacitance values, and may calculate touch coordinates at which touch is inputted.

A touch driving circuit 400 may be disposed on the circuit board 300. The touch driving circuit 400 may be formed as an integrated circuit (IC) and mounted on the circuit board 300.

The light control layer 500 may be disposed on the display panel 100 (e.g., in the third direction D3). In the drawings, the light control layer 500 is illustrated as a separate configuration separated from the display panel 100. However, embodiments of the present disclosure are not necessarily limited thereto. For example, in an embodiment the light control layer 500 may be internalized in (e.g., integrally formed with) the display panel 100 and may be a lower configuration of the display panel 100. Hereinafter, for simplicity of description, an embodiment in which the light control layer 500 is separate from the display panel 100 will be described for convenience of description. However, embodiments of the present disclosure are not necessarily limited thereto.

The light control layer 500 may be disposed on the display panel 100 (e.g, in the third direction DR3). The light control layer 500 may be disposed in the display area DA of the main area MA. The light control layer 500 may adjust a viewing angle of light emitted from the display panel 100.

In an embodiment, the light control layer 500 may include openings OA arranged in the first direction DR1 and the second direction DR2. However, embodiments of the present disclosure are not necessarily limited thereto and the openings OA may be variously arranged. The openings OA are areas through which light passes, and may penetrate light blocking layers 510, 530, and 550 (see FIG. 7), which will be described later. In an embodiment, each of the openings OA may have a quadrilateral shape in plan view, as illustrated in FIGS. 1 and 2. However, embodiments of the present disclosure are not necessarily limited thereto. For example, in some embodiments each of the openings OA may have a circular shape, an elliptical shape, or a polygonal shape in plan view.

The light control layer 500 may include light blocking layers 510, 530, and 550 (see FIG. 7) that block light emitted from the display panel 100 and light transmitting layers 520, 540, and 560 (see FIG. 7) that transmit the light.

A description of the light control layer 500 will be described later with reference to FIG. 7 and the like.

Figure 3:
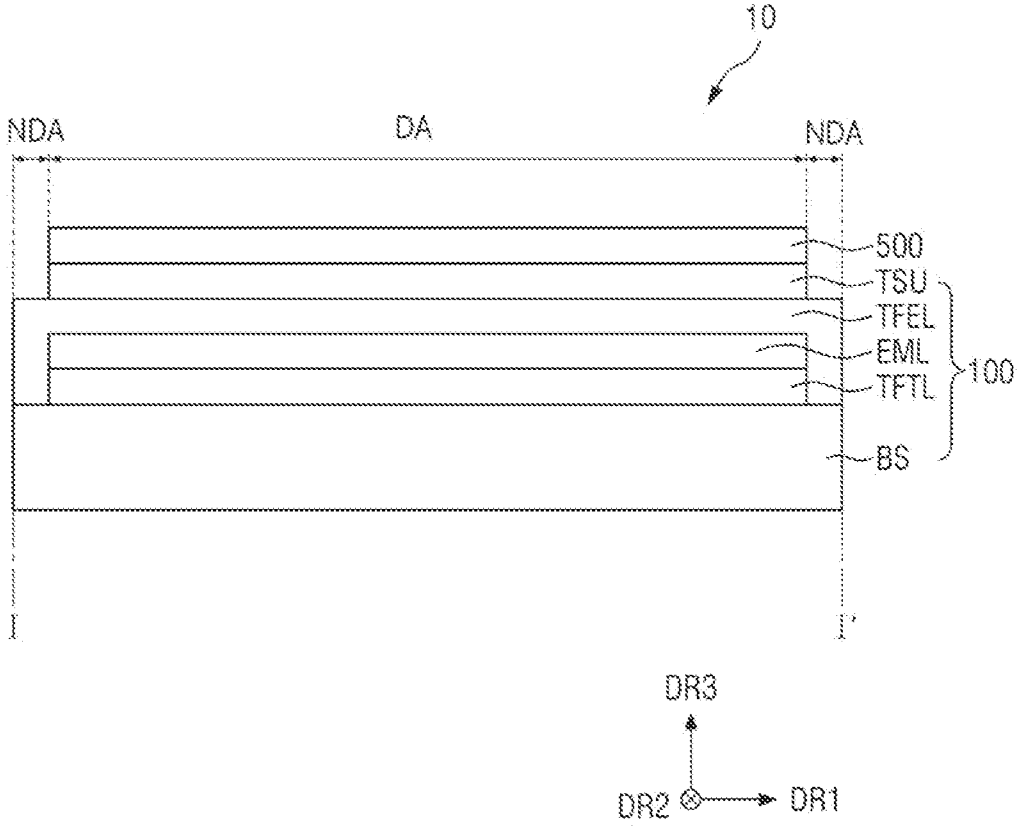
FIG. 3 is a schematic cross-sectional view of the display device taken along line I-I' of FIG. 2 an embodiment of the present disclosure.

FIG. 3 is a schematic cross-sectional view of the display device taken along line I-I' of FIG. 2.

Referring to FIG. 3, the display device 10 may include the display panel 100 and the light control layer 500 disposed on the display panel 100. In an embodiment, the display panel 100 may include a base member BS, a thin film transistor layer TFTL, a light emitting element layer EML, a thin film encapsulation layer TFEL, and the touch sensor layer TSU.

The base member BS may include a substrate. The third direction DR3 may be a thickness direction of the substrate. In an embodiment, the substrate may be formed of an insulating material such as glass, quartz, or a polymer resin. However, embodiments of the present disclosure are not necessarily limited thereto. Examples of a polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), cellulose acetate propionate (CAP), or a combination thereof. Alternatively, the substrate may include a metal material.

The substrate may be a rigid substrate or a flexible substrate which can be bent, folded or rolled. In an embodiment in which the substrate is a flexible substrate, the substrate may be formed of polyimide (PI). However, embodiments of the present disclosure are not necessarily limited thereto.

The thin film transistor layer TFTL may be disposed on the base member BS (e.g., disposed directly thereon in the third direction DR3). In the thin film transistor layer TFTL, scan lines, data lines, power lines, scan control lines, and routing lines connecting pads to data lines, as well as thin film transistors of each of the pixels, may be formed. Each of the thin film transistors may include a gate electrode, a semiconductor layer, a source electrode, and a drain electrode.

The thin film transistor layer TFTL may be disposed in the display area DA and the non-display area NDA. For example, thin film transistors, scan lines, data lines, and power lines of each of the pixels of the thin film transistor layer TFTL may be disposed in the display area DA. The scan control lines and the link lines of the thin film transistor layer TFTL may be disposed in the non-display area NDA.

A light emitting element layer EML may be disposed on the thin film transistor layer TFTL (e.g., disposed directly thereon in the third direction DR3). The light emitting element layer EML may include pixels including a first electrode, a light emitting layer, and a second electrode, and a pixel defining layer defining the pixels. In an embodiment, the light emitting layer may be an organic light emitting layer containing an organic material. In this embodiment, the light emitting layer may include a hole transporting layer, an organic light emitting layer, and an electron transporting layer. When the first electrode is applied with a predetermined voltage through the thin film transistor of the thin film transistor layer TFTL and the second electrode is applied with a cathode voltage, holes and electrons are transferred to the organic light emitting layer through a hole transporting layer and an electron transporting layer, respectively and are combined with each other to emit light in the organic light emitting layer. The pixels of the light emitting element layer EML may be disposed in the display area DA.

The thin film encapsulation layer TFEL may be disposed on the light emitting element layer EML (e.g., disposed directly thereon). The thin film encapsulation layer TFEL may serve to prevent oxygen or moisture from permeating into the light emitting element layer EML. In an embodiment, the thin film encapsulation layer TFEL may include at least one inorganic layer. For example, in an embodiment the inorganic layer may be a silicon nitride layer, a silicon oxynitride layer, a silicon oxide layer, a titanium oxide layer, or an aluminum oxide layer. However, embodiments of the present disclosure are not necessarily limited thereto. In addition, the thin film encapsulation layer TFEL may serve to protect the light emitting element layer EML from foreign substances such as dust. In an embodiment, the thin film encapsulation layer TFEL may include at least one organic layer. For example, the organic layer may include acryl resin, epoxy resin, phenolic resin, polyamide resin, or polyimide resin. However, embodiments of the present disclosure are not necessarily limited thereto.

The thin film encapsulation layer TFEL may be disposed in both the display area DA and the non-display area NDA. For example, the thin film encapsulation layer TFEL may cover the light emitting element layer EML in the display area DA and the non-display area NDA, and may be disposed to cover the thin film transistor layer TFT in the non-display area NDA.

The touch sensor layer TSU may be disposed on (e.g., disposed directly thereon in the third direction DR3) the thin film encapsulation layer TFEL. In an embodiment in which the touch sensor layer TSU is directly disposed on the thin film encapsulation layer TFEL, the display device 10 may have a reduced thickness compared to an embodiment in which a separate touch panel including the touch sensor layer TSU is attached on the thin film encapsulation layer TFEL.

The touch sensor layer TSU may include touch electrodes for sensing a user's touch in a capacitive manner and the touch lines connecting the pads to the touch electrodes. For example, the touch sensor layer TSU may sense a user's touch using a self-capacitance method or a mutual capacitance method.

In an embodiment, the touch electrodes of the touch sensor layer TSU may be disposed in a touch sensor area overlapping the display area DA. The touch lines of the touch sensor layer TSU may be disposed in a touch peripheral area overlapping the non-display area NDA.

The light control layer 500 may be disposed on the touch sensor layer TSU (e.g., disposed directly thereon in the third direction DR3). The light control layer 500 may be disposed to overlap the display area DA. The light control layer 500 may serve to absorb or block light that travels out of a certain angle with respect to the third direction DR3 among light emitted from the light emitting element layer EML.

In an embodiment, the display device 10 may further include a cover window. The cover window may be additionally disposed on the light control layer 500, and in this embodiment, the light control layer 500 and the cover window may be attached by a transparent adhesive member such as an optically clear adhesive (OCA) film.

Figure 4:
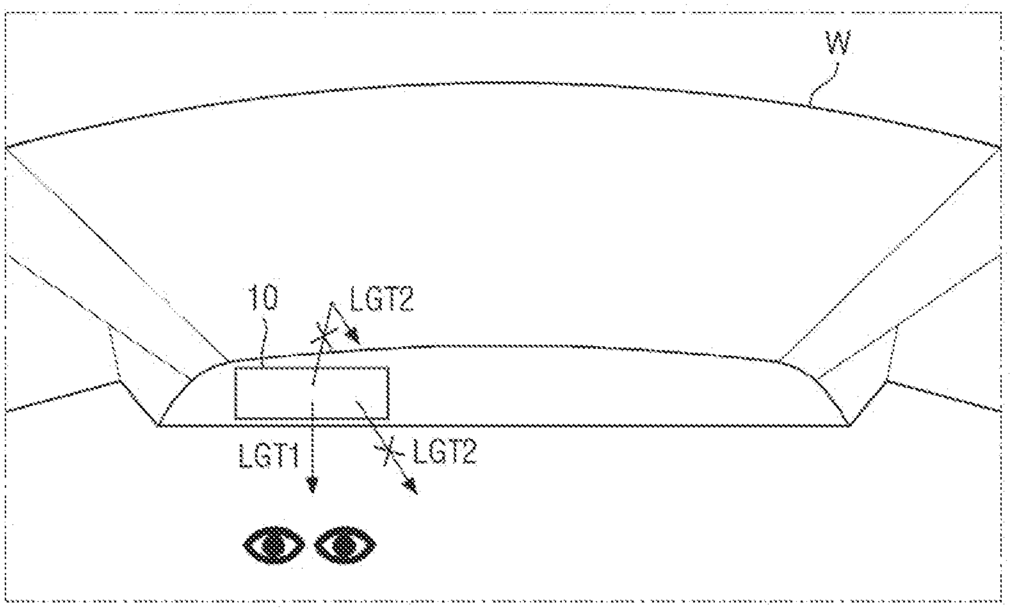
FIG. 4 is a schematic diagram in which a display device according to an embodiment is applied to a vehicle.

FIG. 4 is a schematic diagram in which a display device according to an embodiment is applied to a vehicle.

Referring to FIG. 4, the display device 10 according to an embodiment may be, for example, the display device applied to the vehicle. The vehicle may include a body forming an exterior of the vehicle and an interior space defined by the body. The vehicle body may include a windshield W that protects a driver and a passenger from the outside and provides visibility to the driver. As illustrated in an embodiment of FIG. 4, the display device 10 may be provided in the interior space.

In an embodiment, the display device 10 may be disposed on a dashboard provided in the interior space. For example, in an embodiment the display device 10 may be disposed on the dashboard in front of the driver's seat to provide speed information and the like to the driver, and/or may be disposed on the dashboard in front of the passenger's seat to provide entertainment information and the like to the passenger, and/or may be disposed in the center of the dashboard to provide map information and the like. FIG. 4 illustrates the display device 10 disposed on the dashboard in front of the driver's seat and the driver viewing the display screen of the display device 10 for convenience of explanation. However, embodiments of the present disclosure are not necessarily limited thereto.

The driver may visually recognize (e.g., view) the display screen of the display device 10 through light LGT1 emitted from the display device 10 towards the driver. However, light LGT2 that is a portion of the light emitted from the display device 10 may be reflected on the surrounding windshield W and provided to the driver. In this case, the image reflected on the windshield W may interfere with the driver's visibility of the external environment while driving. However, in the display device 10 according to an embodiment, by adjusting the viewing angle of the light LGT1 and LGT2 emitted from the display device 10 in a front direction (e.g, a direction facing the driver), particularly, the vertical viewing angle, the light LGT2 that is a portion of the light emitted from the display device 10 may be prevented from being reflected on the surrounding windshield W and provided to the driver.

In addition, the light LGT2 that is a portion of the light emitted from the display device 10 may be provided towards the passenger. In this case, the display device 10 may be vulnerable to privacy protection. However, in the display device 10 according to an embodiment, by adjusting the viewing angle of the lights LGT1 and LGT2 emitted from the display device 10 in the front direction (e.g., a direction facing the driver), particularly, the lateral viewing angle, the image displayed on the vehicle display device disposed in front of the driver may not be provided to the passenger.

The viewing angle may be adjusted through the light control layer 500. For example, in an embodiment the viewing angle may be limited to a predetermined angle range through the light control layer 500. For example, when an imaginary line facing the driver in front and extending in a direction perpendicular to the display surface of the display device 10 is regarded as a normal line, the viewing angle may be an angle within about 30° of the normal line.

Figure 5:
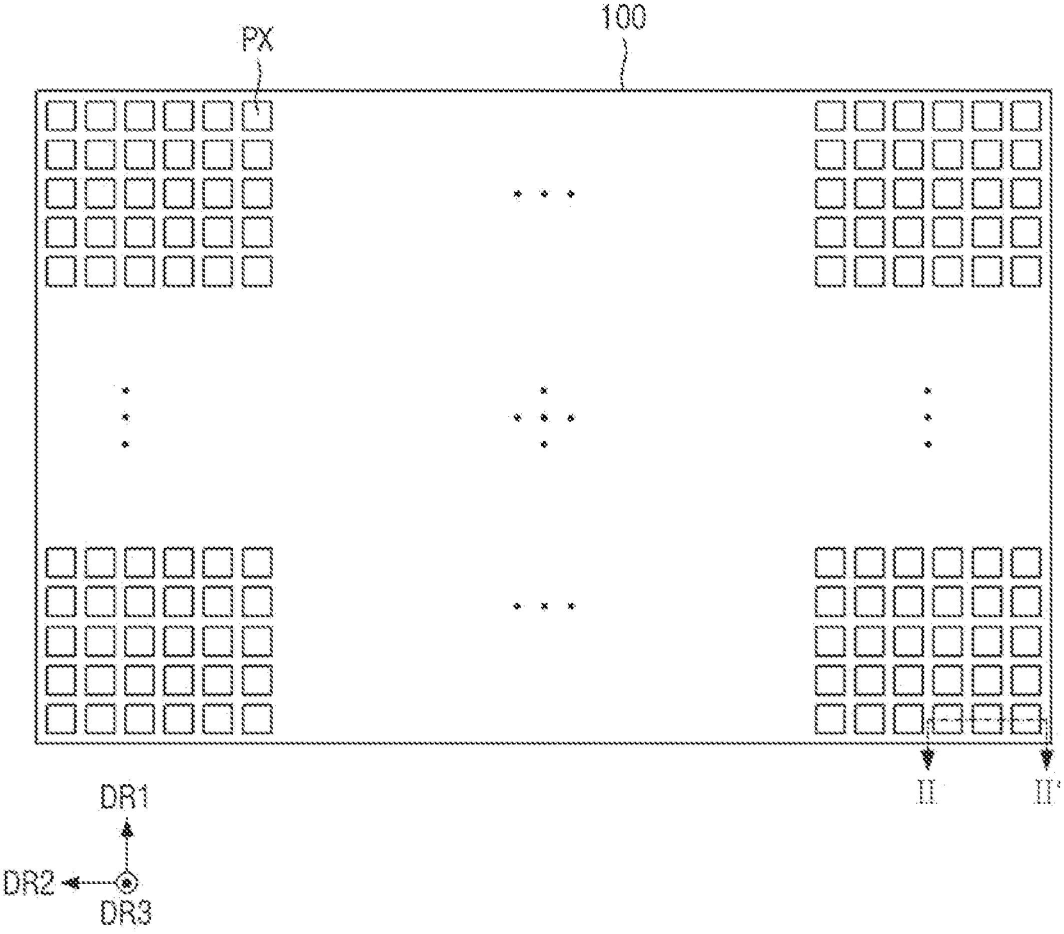
FIG. 5 is a plan view of a display panel an embodiment of the present disclosure.

FIG. 5 is a plan view of a display panel according to an embodiment.

Referring to FIG. 5, the display panel 100 may include the plurality of pixels PX arranged in the first direction DR1 and the second direction DR2. Each of the pixels PX may have a rectangular, square, or rhombic shape in plan view. For example, as shown in the drawing, each of the pixels PX may have a square shape in plan view. However, it is not limited thereto, and may have various shapes such as a polygon, a circle, and an ellipse in plan view.

A first portion of the pixels PX may emit first light, a second portion of the pixels PX may emit second light, and the remaining portion of the pixels PX may emit third light. In an embodiment, the first light may be light of a blue wavelength band, the second light may be light of a red wavelength band, and the third light may be light of a green wavelength band. In an embodiment, the red wavelength band may be a wavelength band in a range of about 600 nm to about 750 nm, the green wavelength band may be a wavelength band in a range of about 480 nm to about 560 nm, and the blue wavelength band may be a wavelength band in a range of about 370 nm to about 460 nm. However, embodiments of the present disclosure are not necessarily limited thereto. In some embodiments, some of the pixels PX may emit white light. However, the colors of the lights emitted by the pixels PX are not necessarily limited thereto and may be variously arranged.

In an embodiment, each of the pixels PX is a light emitting element emitting light, and may include at least one of an organic light emitting element including an organic material, an inorganic light emitting element including an inorganic semiconductor, a quantum dot LED including a quantum dot light emitting layer, and a micro light emitting diode (micro LED). In the following description, an embodiment in which each of the pixels PX includes an organic light emitting element will be mainly described for convenience of description. However, embodiments of the present disclosure are not necessarily limited thereto.

Figure 6:
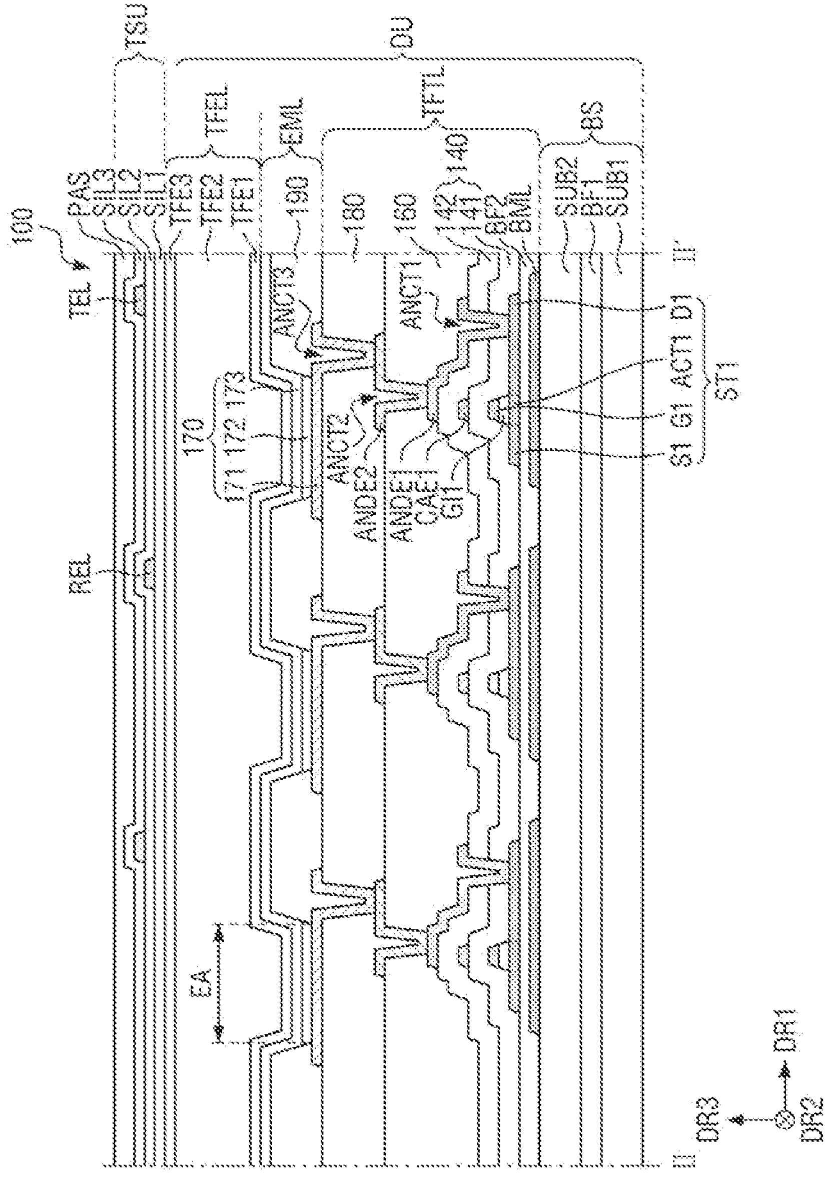
FIG. 6 is a cross-sectional view of the display panel taken along line II-II' of FIG. 5 according an embodiment of the present disclosure.

FIG. 6 is a cross-sectional view of the display panel taken along line II-II' of FIG. 5.

Referring to FIG. 6, the display panel 100 may include a display layer DU and the touch sensor layer TSU. In an embodiment, the display layer DU may include the substrate SUB, the thin film transistor layer TFTL, the light emitting element layer EML, and the thin film encapsulation layer TFEL.

In an embodiment, the base member BS may include a first substrate SUB1, a first buffer layer BF1 disposed on the first substrate SUB1 (e.g., directly thereon in the third direction DR3), and a second substrate SUB2 disposed on the first buffer layer BF1 (e.g., directly thereon in the third direction DR3).

In an embodiment, the first substrate SUB1 and the second substrate SUB2 may be made of an insulating material such as glass, quartz, polymer resin or the like. Examples of a polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), cellulose acetate propionate (CAP), or a combination thereof. Alternatively, the substrate may include a metal material. However, embodiments of the present disclosure are not necessarily limited thereto.

The first substrate SUB1 and the second substrate SUB2 may be a rigid substrate, or a flexible substrate which can be bent, folded or rolled. In an embodiment in which the substrate is a flexible substrate, the substrate may be formed of polyimide (PI). However, embodiments of the present disclosure are not necessarily limited thereto.

The first buffer layer BF1 is a layer for protecting a first thin film transistor ST1 and a light emitting layer 172 from moisture permeating through the first substrate SUB1 and the second substrate SUB2 which are susceptible to moisture permeation. In an embodiment, the first buffer layer BF1 may be formed of a plurality of inorganic layers that are alternately stacked. For example, the first buffer layer BF1 may be formed of multiple layers in which one or more inorganic layers of a silicon nitride layer, a silicon oxynitride layer, a silicon oxide layer, a titanium oxide layer and an aluminum oxide layer are alternately stacked. However, embodiments of the present disclosure are not necessarily limited thereto.

In an embodiment, the thin film transistor layer TFTL may include a lower metal layer BML, a second buffer layer BF2, the first thin film transistor ST1, a first gate insulating layer GI1, a first interlayer insulating layer 141, a first capacitor electrode CAE1, a second interlayer insulating layer 142, a first anode connection electrode ANDE1, a first organic layer 160, a second anode connection electrode ANDE2, and a second organic layer 180.

The lower metal layer BML may be disposed on the second substrate SUB2 (e.g., disposed directly thereon in the third direction DR3). In an embodiment the lower metal layer BML may overlap a first active layer ACT1 of the first thin film transistor ST1 in the third direction DR3 to prevent a leakage current from being generated when light is incident on the first active layer ACT1 of the first thin film transistor ST1. In an embodiment, the lower metal layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto. For example, in an embodiment the lower metal layer BML may be omitted.

The second buffer layer BF2 may be disposed on the lower metal layer BML (e.g., disposed directly thereon). The second buffer layer BF2 is a layer for protecting a first thin film transistor ST1 and a light emitting layer 172 from moisture permeating through the first substrate SUB1 and the second substrate SUB2 which are susceptible to moisture permeation. In an embodiment the second buffer layer BF2 may be formed of a plurality of inorganic layers that are alternately stacked. For example, in an embodiment the second buffer layer BF2 may be formed of multiple layers in which one or more inorganic layers of a silicon nitride layer, a silicon oxynitride layer, a silicon oxide layer, a titanium oxide layer and an aluminum oxide layer are alternately stacked. However, embodiments of the present disclosure are not necessarily limited thereto.

The first active layer ACT1 of the first thin film transistor ST1 may be disposed on the second buffer layer BF2 (e.g., disposed directly thereon in the third direction DR3). In an embodiment, the first active layer ACT1 of the first thin film transistor ST1 includes polycrystalline silicon, monocrystalline silicon, low-temperature polycrystalline silicon, amorphous silicon, or an oxide semiconductor. The first active layer ACT1 of the first thin film transistor ST1, which is exposed without being covered by a first gate insulating layer GI1, is doped with impurities or ions, and thus may have conductivity. Accordingly, a first source electrode S1 and a first drain electrode D1 of the first active layer ACT1 of the first thin film transistor ST1 may be formed.

A first gate insulating layer GI1 may be disposed on the first active layer ACT1 of the first thin film transistor ST1 (e.g., disposed directly thereon in the third direction DR3). Although FIG. 5 illustrates that the first gate insulating layer GI1 is disposed between the first active layer ACT1 and a first gate electrode G1 of the first thin film transistor ST1, embodiments of the present disclosure are not necessarily limited thereto. The first gate insulating layer GI1 may be disposed between a first interlayer insulating layer 141 and the first active layer ACT1 and between the first interlayer insulating layer 141 and the second buffer layer BF2. In an embodiment, the first gate insulating layer GI1 may be formed of an inorganic layer, for example, a silicon nitride layer, a silicon oxynitride layer, a silicon oxide layer, a titanium oxide layer, or an aluminum oxide layer. However, embodiments of the present disclosure are not necessarily limited thereto.

The first gate electrode G1 of the first thin film transistor ST1 may be disposed on the first gate insulating layer GI1 (e.g., disposed directly thereon in the third direction DR3). The first gate electrode G1 of the first thin film transistor ST1 may overlap the first active layer ACT1 in the third direction DR3. In an embodiment, the first gate electrode G1 of the first thin film transistor ST1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto.

The first interlayer insulating layer 141 may be disposed on the first gate electrode G1 of the first thin film transistor ST1 (e.g., disposed directly thereon). In an embodiment, the first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers. However, embodiments of the present disclosure are not necessarily limited thereto.

The first capacitor electrode CAE1 may be disposed on the first interlayer insulating layer 141 (e.g., disposed directly thereon in the third direction DR3). The first capacitor electrode CAE1 may overlap the first gate electrode G1 of the first thin film transistor ST1 in the third direction DR3. Since the first interlayer insulating layer 141 has a predetermined dielectric constant, the first capacitor electrode CAE1, the first gate electrode G1, and the first interlayer insulating layer 141 disposed therebetween may form a capacitor. In an embodiment, the first capacitor electrode CAE1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto.

In an embodiment, the second interlayer insulating layer 142 may be disposed on the first capacitor electrode CAE1. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers. However, embodiments of the present disclosure are not necessarily limited thereto.

The first anode connection electrode ANDE1 may be disposed on the second interlayer insulating layer 142 (e.g., disposed directly thereon in the third direction DR3). The first anode connection electrode ANDE1 may penetrate through the first interlayer insulating layer 141 and the second interlayer insulating layer 142 to be connected to the first drain electrode D1 of the first thin film transistor ST1 via a first anode contact hole ANCT1 that exposes the first drain electrode D1 of the first thin film transistor ST1. In an embodiment, the first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof. However, embodiments of the present disclosure are not necessarily limited thereto.

The first organic layer 160 for planarization may be disposed on the first anode connection electrode ANDE1 (e.g., disposed directly thereon). In an embodiment, the first organic layer 160 may be formed of an organic layer such as acryl resin, epoxy resin, phenolic resin, polyamide resin, polyimide resin and the like. However, embodiments of the present disclosure are not necessarily limited thereto.

The second anode connection electrode ANDE2 may be disposed on the first organic layer 160 (e.g., disposed directly thereon). The second anode connection electrode ANDE2 may be connected to the first anode connection electrode ANDE1 via the second anode contact hole ANCT2 penetrating the first organic layer 160 to expose the first anode connection electrode ANDE1. In an embodiments, the second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof. However, embodiments of the present disclosure are not necessarily limited thereto.

A second organic layer 180 may be disposed on the second anode connection electrode ANDE2 (e.g., disposed directly thereon). In an embodiment, the second organic layer 180 may be formed of an organic layer such as acryl resin, epoxy resin, phenolic resin, polyamide resin, polyimide resin and the like. However, embodiments of the present disclosure are not necessarily limited thereto.

Although FIG. 5 illustrates that the first thin film transistor ST1 is configured to be a top gate type in which the first gate electrode G1 is located on top of the first active layer ACT1, embodiments of the present disclosure are not necessarily limited thereto. In some embodiments, the first thin film transistor ST1 may be a bottom gate type in which the first gate electrode G1 is located under the first active layer ACT1, or a double gate type in which the first gate electrode G1 is located both above and under the first active layer ACT1.

The light emitting element layer EML may be disposed on the second organic layer 180. The light emitting element layer EML may include light emitting elements 170 and a bank 190 (e.g., disposed directly thereon in the third direction DR3). In an embodiment, each of the light emitting elements 170 may include a first light emitting electrode 171, the light emitting layer 172, and a second light emitting electrode 173.

The first light emitting electrode 171 may be formed on the second organic layer 180 (e.g., formed directly thereon). The first light emitting electrode 171 may penetrate through the second organic layer 180 to be connected to the second anode connection electrode ANDE2 via a third anode contact hole ANCT3 that exposes the second anode connection electrode ANDE2.

In an embodiment having a top emission structure in which light is emitted toward the second light emitting electrode 173 when viewed with respect to the light emitting layer 172, the first light emitting electrode 171 may be formed of a metal material having high reflectivity to have a stacked structure (Ti/Al/Ti) of aluminum and titanium, a stacked structure (ITO/AV/ITO) of aluminum and ITO, an APC alloy, and a stacked structure (ITO/APC/ITO) of an APC alloy and ITO. The APC alloy is an alloy of silver (Ag), palladium (Pd) and copper (Cu).

The bank 190 may be formed on the second organic layer 180 (e.g., formed directly thereon in the third direction DR3) to partition the first light emitting electrode 171, thereby defining an emission area EA. The light emitting element layer 172 may include a plurality of emission areas EA. The bank 190 may be formed to cover the edge of the first light emitting electrode 171. In an embodiment, the bank 190 may be formed of an organic layer such as acryl resin, epoxy resin, phenolic resin, polyamide resin, polyimide resin and the like.

The emission area EA is an area in which the first light emitting electrode 171, the light emitting layer 172, and the second light emitting electrode 173 are sequentially stacked, and holes from the first light emitting electrode 171 and electrons from the second light emitting electrode 173 are combined with each other in the light emitting layer 172 to emit light.

The light emitting layer 172 is formed on the first light emitting electrode 171 and the bank 190. In an embodiment, the light emitting layer 172 may include an organic material to emit light in a predetermined color. For example, the light emitting layer 172 may include a hole transporting layer, an organic material layer, and an electron transporting layer.

The second light emitting electrode 173 may be disposed on the light emitting layer 172. The second light emitting electrode 173 may be formed to cover the light emitting layer 172. The second light emitting electrode 173 may be a common layer formed in common for all the emission areas EA. In some embodiments, a capping layer may be formed on the second light emitting electrode 173.

In an embodiment having the top emission structure, the second light emitting electrode 173 may be formed of transparent conductive oxide (TCO) such as indium tin oxide (ITO) and indium zinc oxide (IZO) capable of transmitting light or a semi-transmissive conductive material such as magnesium (Mg), silver (Ag), or an alloy of magnesium (Mg) and silver (Ag). In an embodiment in which the second light emitting electrode 173 is formed of a semi-transmissive conductive material, the light emission efficiency can be increased due to a micro-cavity effect.

The thin film encapsulation layer TFEL may be disposed on the second light emitting electrode 173 (e.g., in the third direction DR3). In an embodiment, the thin film encapsulation layer TFEL may include at least one inorganic layer to prevent oxygen or moisture from permeating into the light emitting element layer. In addition, the thin film encapsulation layer TFEL may include at least one organic layer to protect the light emitting element layer from foreign substances such as dust. For example, in an embodiment the thin film encapsulation layer TFEL may include a first encapsulation film TFE1, a second encapsulation film TFE2, and a third encapsulation film TFE3.

The first encapsulation film TFE1 (e.g., a first inorganic encapsulation film) may be disposed on the second light emitting electrode 173 (e.g., disposed directly thereon). In an embodiment, the first encapsulation film TFE1 may be an inorganic layer of a single layer or multiple layers. The first encapsulation film TFE1 may be formed as a single layer or a multilayer in which one or more inorganic layers of a silicon nitride layer, a silicon oxynitride layer, a silicon oxide layer, a titanium oxide layer and an aluminum oxide layer are alternately stacked. However, embodiments of the present disclosure are not necessarily limited thereto.

The second encapsulation film TFE2 (e.g., a first organic encapsulation film) may be disposed on the first encapsulation film TFE1 (e.g., disposed directly thereon). In an embodiment, the second encapsulation film TFE2 may be an organic layer of a single layer or multiple layers. The second encapsulation film TFE2 may include a polymer-based material. Polymer-based materials may include polyethylene terephthalate, polyethylene naphthalate, polycarbonate, polyimide, polyethylene sulfonate, polyoxymethylene, polyarylate, hexamethyldisiloxane, and acrylic resins (e.g., polymethyl methacrylate, polyacrylic acid, or the like), or any combination thereof. However, embodiments of the present disclosure are not necessarily limited thereto.

The third encapsulation film TFE3 (e.g., a second inorganic encapsulation film) may be disposed on the second encapsulation film TFE2 (e.g., disposed directly thereon). The third encapsulation film TFE3 may be an inorganic layer of a single layer or multiple layers. The third encapsulation film TFE3 may include the same material as the first encapsulation film TFE1. For example, the third encapsulation film TFE3 may be formed as a single layer or a multilayer in which one or more inorganic layers of a silicon nitride layer, a silicon oxynitride layer, a silicon oxide layer, a titanium oxide layer and an aluminum oxide layer are alternately stacked. However, embodiments of the present disclosure are not necessarily limited thereto.

In an embodiment, the refractive index of the first encapsulation film TFE1 and the refractive index of the third encapsulation film TFE3 may be greater than the refractive index of the second encapsulation film TFE2. For example, the refractive index of the first encapsulation film TFE1 and the refractive index of the third encapsulation film TFE3 may be in a range of about 1.55 to about 1.7. The refractive index of the second encapsulation film TFE2 may be in a range of about 1.45 to about 1.55.

In the present specification, the refractive index may be a value measured using light (sodium D-line) of approximately 589 nm in a standard state of approximately 20° C. and 1 atmospheric pressure.

The thickness (e.g., length in the third direction DR3) of the second encapsulation film TFE2 may be greater than the thicknesses (e.g., length in the third direction DR3) of the first encapsulation film TFE1 and the third encapsulation film TFE3. For example, in an embodiment the thickness of the second encapsulation film TFE2 may be in a range of about 3.3 μm to 6.6 μm. The thicknesses of the first encapsulation film TFE1 and the third encapsulation film TFE3 may be in a range of about 0.55 μm to about 1.1 μm.

In an embodiment, the touch sensor layer TSU may be disposed on the thin film encapsulation layer TFEL (e.g., disposed directly thereon in the third direction DR3). The touch sensor layer TSU may include a plurality of touch electrodes for sensing a user's touch in a capacitive manner and the touch lines connecting the plurality of touch electrodes to a touch driver. For example, the touch sensor layer TSU may sense the user's touch by using a mutual capacitance method or a self-capacitance method.

However, embodiments of the present disclosure are not necessarily limited thereto. For example, in an embodiment, the touch sensor layer TSU may be disposed on a separate substrate disposed on the display layer DU. In this embodiment, the substrate supporting the touch sensor layer TSU may be an encapsulation member encapsulating the display layer DU.

The plurality of touch electrodes of the touch sensor layer TSU may be disposed in a touch sensor area overlapping the display area. The touch lines of the touch sensor layer TSU may be disposed in the touch peripheral area overlapping the non-display area.

The touch sensor layer TSU may include a first touch insulating layer SIL1, a first touch electrode REL, a second touch insulating layer SIL2, a second touch electrode TEL, and a third touch insulating layer SIL3.

The first touch insulating layer SIL1 may be disposed on the thin film encapsulation layer TFE1 (e.g., disposed directly thereon in the third direction DR3). The first touch insulating layer SIL1 may have insulating and optical functions. In an embodiment, the first touch insulating layer SIL1 may include at least one inorganic layer. For example, the first touch insulating layer SIL1 may be an inorganic layer containing at least one of a silicon nitride layer, a silicon oxynitride layer, a silicon oxide layer, a titanium oxide layer, or an aluminum oxide layer. However, embodiments of the present disclosure are not necessarily limited thereto. For example, in an embodiment the first touch insulating layer SIL1 may be omitted.

The first touch electrode REL may be disposed on the first touch insulating layer SIL1 (e.g., disposed directly thereon in the third direction DR3). The first touch electrode REL may not overlap the light emitting element 170 (e.g., in the third direction DR3). In an embodiment, the first touch electrode REL may be formed as a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO. However, embodiments of the present disclosure are not necessarily limited thereto.

Figure 8:
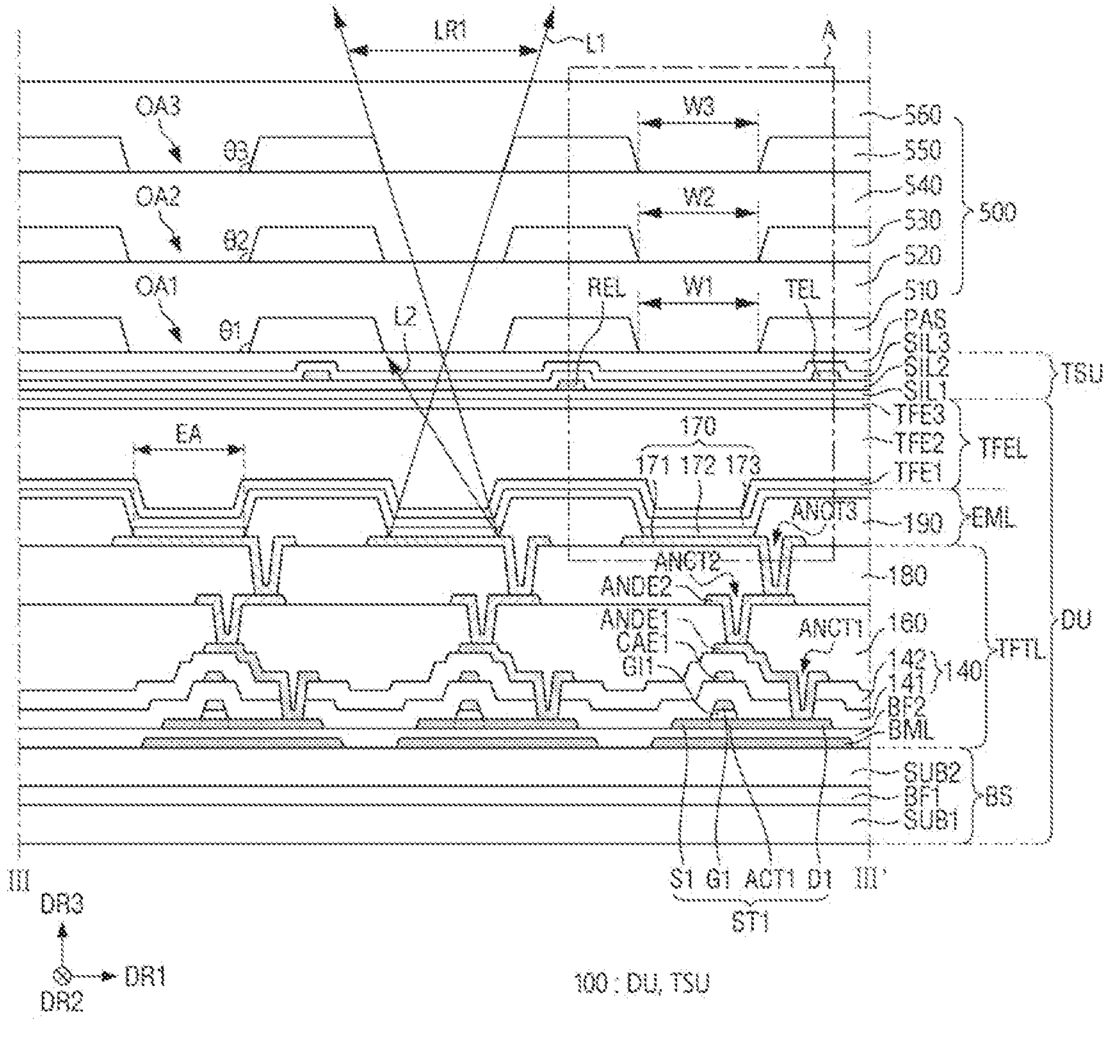
FIG. 8 is a cross-sectional view of a display panel and a light control layer taken along line III-III' of FIG. 7 according to an embodiment of the present disclosure.

In an embodiment, as illustrated in FIG. 8, the first touch electrode REL may not overlap the first to third openings OA1, OA2, and OA3 in the third direction DR3, and may overlap the light blocking layers 510, 530, and 550 in the third direction DR3.

The second touch insulating layer SIL2 may cover the first touch electrode REL and the first touch insulating layer SIL1. The second touch insulating layer SIL2 may have insulating and optical functions. For example, in an embodiment the second touch insulating layer SIL2 may be made of a same material as previously described concerning the first touch insulating layer SIL1.

The second touch electrode TEL may be disposed on the second touch insulating layer SIL2 (e.g, disposed directly thereon in the third direction DR3). The second touch electrode TEL may not overlap the light emitting element 170 (e.g., in the third direction DR3). In an embodiment, the second touch electrode TEL may be formed as a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO. However, embodiments of the present disclosure are not necessarily limited thereto.

In an embodiment, as illustrated in FIG. 8, the second touch electrode TEL may not overlap the openings OA1, OA2, and OA3 in the third direction DR3, and may overlap the light blocking layers 510, 530, and 550 in the third direction DR3.

The third touch insulating layer SIL3 may cover the second touch electrode TEL and the second touch insulating layer SIL2. The third touch insulating layer SIL3 may have insulating and optical functions. In an embodiment, the third touch insulating layer SIL3 may be made of a same material as previously described concerning the second touch insulating layer SIL2.

In an embodiment, each of the refractive indices of the first touch insulating layer SIL1, the second touch insulating layer SIL2, and the third touch insulating layer SIL3 may be greater than or equal to the refractive index of the first encapsulation film TFE1 and the refractive index of the third encapsulation film TFE3 as inorganic films. In an embodiment, each of the refractive indices of the first touch insulating layer SIL1, the second touch insulating layer SIL2, and the third touch insulating layer SIL3 may be greater than the refractive index of the second encapsulation film TFE2. For example, in an embodiment the refractive indices of the first touch insulating layer SIL1, the second touch insulating layer SIL2, and the third touch insulating layer SIL3 may be in a range of about 1.55 to about 1.7.

In some embodiments, the first touch insulating layer SIL1, the second touch insulating layer SIL2, and the third touch insulating layer SIL3 may be organic layers. For example, each of the first touch insulating layer SIL1, the second touch insulating layer SIL2, and the third touch insulating layer SIL3 may be an organic layer such as acryl resin, epoxy resin, phenolic resin, polyamide resin, polyimide resin, or the like.

In an embodiment in which the first touch insulating layer SIL1, the second touch insulating layer SIL2, and the third touch insulating layer SIL3 are organic layers, the first touch insulating layer SIL1, the second touch insulating layer SIL2, and the third touch insulating layer SIL3 may be high refractive organic layers having high refractive indices. For example, the refractive indices of the first touch insulating layer SIL1, the second touch insulating layer SIL2, and the third touch insulating layer SIL3 may be in a range of about 1.55 to about 1.7.

In an embodiment in which the first touch insulating layer SIL1, the second touch insulating layer SIL2, and the third touch insulating layer SIL3 are organic layers, nanoparticles such as zirconium oxide (ZrOx) and titanium oxide (TiOx) may be included to increase the refractive index. In an embodiment, the size of the nanoparticles may be within approximately 50 μm (e.g., less than or equal to about 50 μm).

The touch sensor layer TSU may further include a planarization layer PAS for planarization. In an embodiment, the planarization layer PAS may be formed of an organic layer such as acryl resin, epoxy resin, phenolic resin, polyamide resin, polyimide resin and the like.

In an embodiment, the refractive index of the planarization layer PAS may be the same as the refractive index of any one of the first touch insulating layer SIL1, the second touch insulating layer SIL2, and the third touch insulating layer SIL3. For example, in an embodiment the refractive index of the planarization layer PAS may be in a range of about 1.55 to about 1.7.

In an embodiment in which the planarization layer PAS is an organic layer, nanoparticles such as zirconium oxide (ZrOx) and titanium oxide (TiOx) may be included to increase the refractive index. In an embodiment, the size of the nanoparticles may be within approximately 50 μm.

In some embodiments, the refractive indices of the first touch insulating layer SIL1, the second touch insulating layer SIL2, the third touch insulating layer SIL3, and the planarization layer PAS may be greater than or equal to the refractive indices of the first encapsulation film TFE1 and the third encapsulation film TFE3 which are inorganic films. For example, the refractive indices of the first touch insulating layer SIL1, the second touch insulating layer SIL2, the third touch insulating layer SIL3, and the planarization layer PAS may be greater than the refractive index of the second encapsulation film TFE2 that is an organic film.

Figure 7:
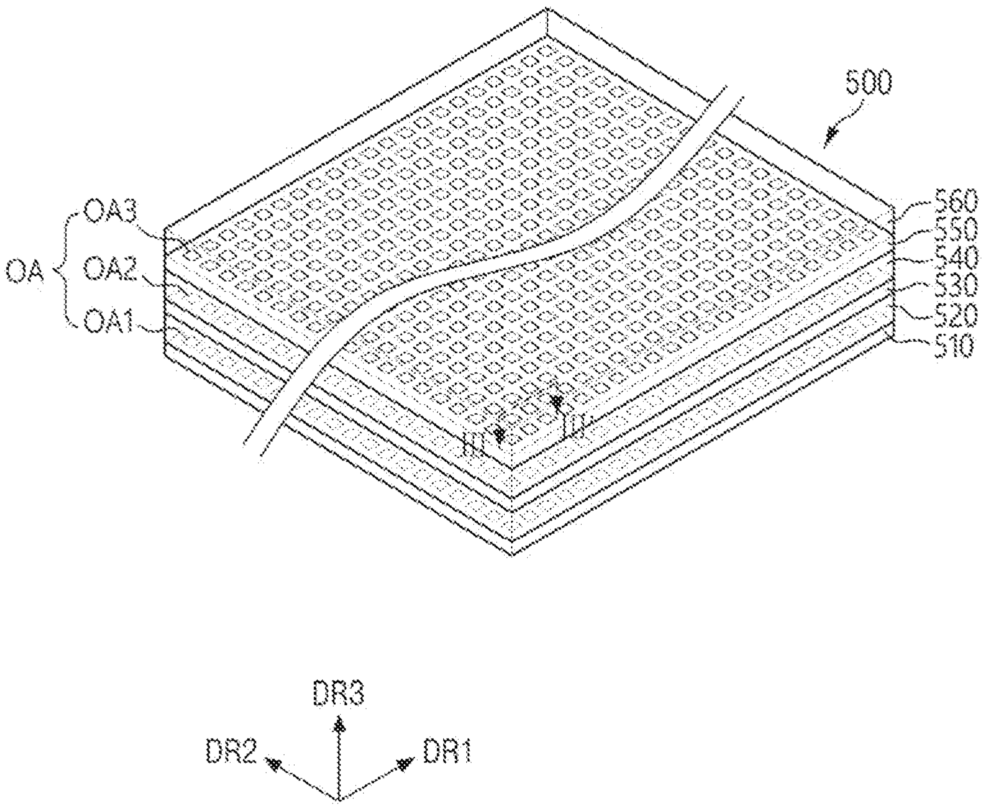
FIG. 7 is a perspective view of a light control layer according to an embodiment of the present disclosure.
Figure 9:
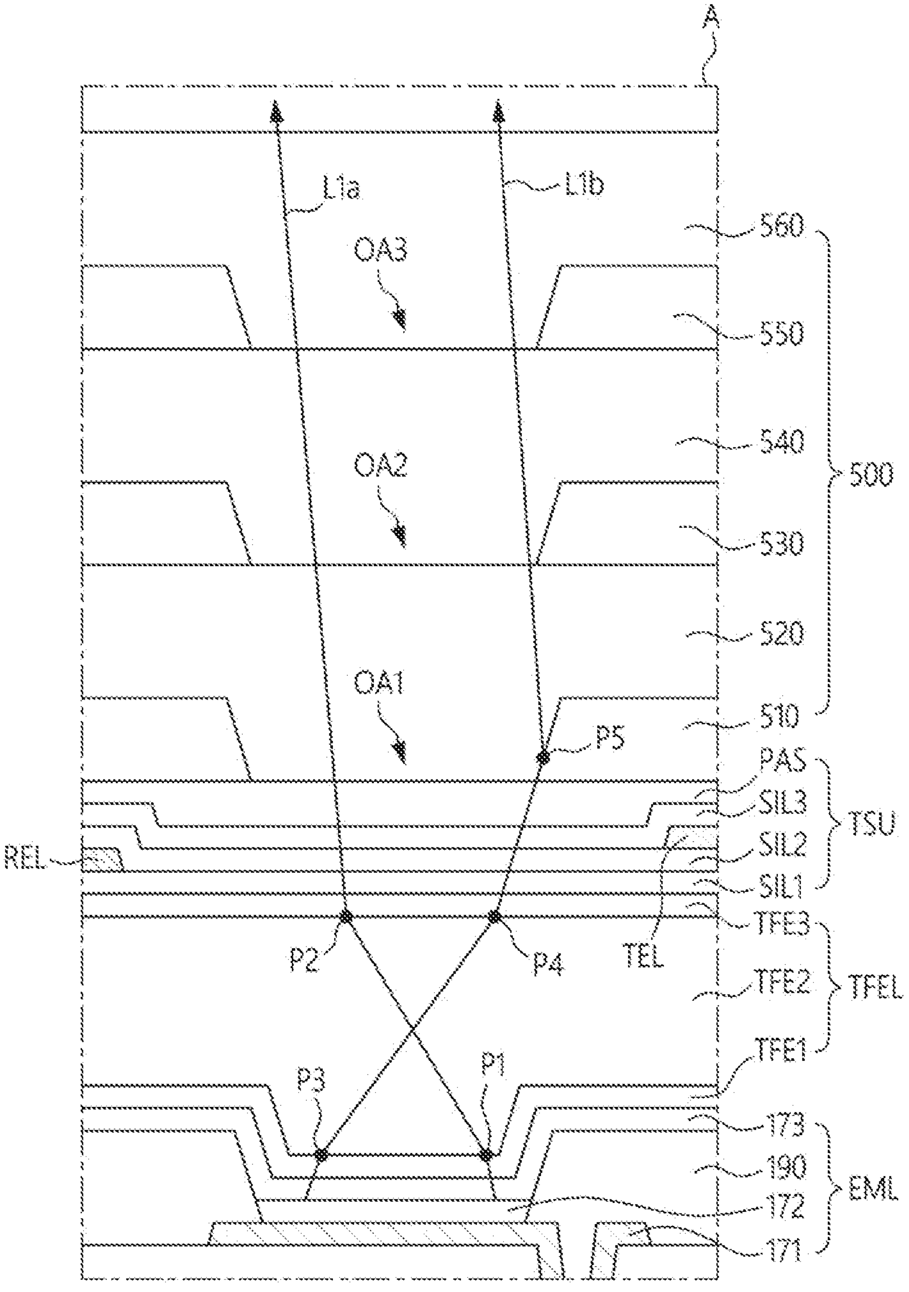
FIG. 9 is an enlarged view of part A of FIG. 8 according to an embodiment of the present disclosure.

FIG. 7 is a perspective view of a light control layer according to an embodiment. FIG. 8 is a cross-sectional view of a display panel and a light control layer according to an embodiment. FIG. 9 is an enlarged view of part A of FIG. 8.

Referring to FIGS. 7 to 9, in an embodiment the light control layer 500 may include the first light blocking layer 510, the first light transmitting layer 520, the second light blocking layer 530, the second light transmitting layer 540, the third light blocking layer 550, and the third light transmitting layer 560.

The first light blocking layer 510 may be disposed on the touch sensor layer TSU (e.g., disposed directly thereon in the third direction DR3). The first light blocking layer 510 may be disposed on the display area DA of the display panel 100. In an embodiment, the first light blocking layer 510 may have a rectangular parallelepiped shape as shown in FIG. 7. However, embodiments of the present disclosure are not necessarily limited thereto. The shape of the first light blocking layer 510 may be the same as that of the display area DA in a plan view. The first light blocking layer 510 may overlap the plurality of touch electrodes REL and TEL in the third direction DR3. Since the first light blocking layer 510 and the plurality of touch electrodes REL and TEL are disposed not to overlap the emission area EA (e.g. in the third direction DR3), the luminance and display quality of the display device 10 may be increased.

The first light blocking layer 510 may include first openings OA1. The first openings OA1 may transmit light emitted from the display panel 100. In an embodiment, the first openings OA1 may be disposed along the first direction DR1 and the second direction DR2. For example, the first openings OA1 may be arranged in a matrix form.

The length of each of the first openings OA1 in the first direction DR1 and the length thereof in the second direction DR2 may be substantially the same or different. The interval between the first openings OA1 in the first direction DR1 and the interval between the first openings OA1 in the second direction DR2 may be substantially the same or different.

In some embodiments, the first openings OA1 may overlap the pixels PX in the third direction DR3. In an embodiment, the sizes and shapes of the first openings OA1 may be the same as the sizes and shapes of the pixels PX, respectively. However, embodiments of the present disclosure are not necessarily limited thereto. The first openings OA1 may overlap the emission area EA in the third direction DR3 (e.g., in a thickness direction of the substrate).

As shown in an embodiment of FIG. 8, a first angle θ1 between the sidewalls of the first openings OA1 and the horizontal direction within the first opening OA1 may be in a range of about 90 degrees to about 110 degrees. In an embodiment in which the first angle θ1 is greater than or equal to about 90 degrees, light emitted from the display panel 100 is prevented from being reflected from the sidewalls of the first openings OA1 and proceeding toward the display panel 100 again, so that the front light emission efficiency may be increased. In an embodiment in which the first angle θ1 is about 110 degrees or less, light reflected from the sidewalls of the first openings OA1 is prevented from being blocked again by the second light blocking layer 530 or the third light blocking layer 550 on the upper side, so that the front light emission efficiency may be increased.

The first light blocking layer 510 may block or absorb light emitted from the display panel 100. The first light blocking layer 510 may include a material that blocks or absorbs light. In an embodiment, the first light blocking layer 510 may include a light blocking organic material (e.g., an organic material that blocks or absorb light). For example, the first light blocking layer 510 is a light blocking material that absorbs or blocks light, and may include carbon black, organic black pigment, blue pigment, blue dye, green pigment, and/or green dye. Further, the first light blocking layer 510 may include an organic material such as acryl resin, epoxy resin, phenolic resin, polyamide resin, polyimide resin, or the like. However, embodiments of the present disclosure are not necessarily limited thereto.

In some embodiments, the refractive index of the first light blocking layer 510 may be less than the refractive index of the first light transmitting layer 520 described below. The refractive index of the first light blocking layer 510 may be greater than the refractive index of the second encapsulation film TFE2 of the thin film encapsulation layer TFEL. For example, in an embodiment the refractive index of the first light blocking layer 510 may be in a range of about 1.4 to about 1.55.

In an embodiment, for adjusting the refractive index, the first light blocking layer 510 may include an epoxy-based resin and/or an acryl-based resin containing fluorine (F), or may further include silicon dioxide ($SiO_2$) and/or hollow silica. The first light blocking layer 510 may have a thickness in a range of about 1 μm to about 2 μm.

The first light transmitting layer 520 may be disposed on the first light blocking layer 510 (e.g., disposed directly thereon). In an embodiment, the first light transmitting layer 520 may have a rectangular parallelepiped shape as shown in the drawing. However, embodiments of the present disclosure are not necessarily limited thereto. The first light transmitting layer 520 may fill (e.g., completely fill) the first openings OA1 of the first light blocking layer 510.

The first light transmitting layer 520 may transmit light emitted from the display panel 100. In an embodiment, the first light transmitting layer 520 may be an organic layer including a transparent organic material capable of transmitting light. For example, in an embodiment the first light transmitting layer 520 may include an organic layer such as acryl resin, epoxy resin, phenolic resin, polyamide resin, polyimide resin and the like. However, embodiments of the present disclosure are not necessarily limited thereto. For example, in an embodiment, the first light transmitting layer 520 may be an inorganic layer capable of transmitting light. For example, the first light transmitting layer 520 may include a silicon nitride layer, a silicon oxynitride layer, a silicon oxide layer, a titanium oxide layer, or an aluminum oxide layer.

The refractive index of the first light transmitting layer 520 may be greater than the refractive index of the first light blocking layer 510. The refractive index of the first light transmitting layer 520 may also be greater than a refractive index of the second encapsulation film TFE2. In an embodiment, the refractive index of the first light transmitting layer 520 may be greater than or equal to a refractive index of the third encapsulation film TFE3. For example, in an embodiment the difference between the refractive index of the first light transmitting layer 520 and the refractive index of the first light blocking layer 510 may be in a range of about 0.1 to about 0.15. The refractive index of the first light transmitting layer 520 may be in a range of about 1.55 to about 1.7. In an embodiment in which the first light transmitting layer 520 is an organic layer, nanoparticles such as zirconium oxide (ZrOx) and titanium oxide (TiOx) may be included to increase the refractive index. In an embodiment, the size of the nanoparticles may be within approximately 50 μm.

The second light blocking layer 530 may be disposed on the first light transmitting layer 520 (e.g., disposed directly thereon). The second light blocking layer 530 may be disposed on the display area DA of the display panel 100. In an embodiment, the second light blocking layer 530 may have a rectangular parallelepiped shape as shown in the FIG. 7. However, embodiments of the present disclosure are not necessarily limited thereto. The shape of the second light blocking layer 530 may be the same as that of the first light blocking layer 510. The second light blocking layer 530 may overlap the plurality of touch electrodes REL and TEL in the third direction DR3. Since the second light blocking layer 530 and the plurality of touch electrodes REL and TEL are disposed not to overlap the emission area EA, the luminance and display quality of the display device 10 may be increased.

The second light blocking layer 530 may include second openings OA2. The second openings OA2 may transmit light emitted from the display panel 100. In an embodiment, the second openings OA2 may be disposed along the first direction DR1 and the second direction DR2. For example, the second openings OA2 may be arranged in a matrix form.

The length of each of the second openings OA2 in the first direction DR1 and the length thereof in the second direction DR2 may be substantially the same or different. The interval between the second openings OA2 in the first direction DR1 and the interval between the second openings OA2 in the second direction DR2 may be substantially the same or different.

In some embodiments, the second openings OA2 may overlap the pixels PX in the third direction DR3. In an embodiment, the sizes and shapes of the second openings OA2 may be the same as the sizes shapes of the pixels PX, respectively. However, embodiments of the present disclosure are not necessarily limited thereto. The second openings OA2 may overlap the emission area EA. The second openings OA2 may overlap the first openings OA1 in the third direction DR3 (e.g., in a thickness direction of the substrate).

In an embodiment, a second angle θ2 between the sidewalls of the second openings OA2 and the horizontal direction within the second opening OA2 may be in a range of about 90 degrees to about 110 degrees. In an embodiment in which the second angle θ2 is greater than or equal to about 90 degrees, light emitted from the display panel 100 is prevented from being reflected from the sidewalls of the second openings OA2 and proceeding toward the display panel 100 again, so that the front light emission efficiency may be increased. In an embodiment in which the second angle θ2 is about 110 degrees or less, light reflected from the sidewalls of the second openings OA2 is prevented from being blocked again by the third light blocking layer 550 on the upper side, so that the front light emission efficiency may be increased.

The second light blocking layer 530 may block or absorb light emitted from the display panel 100. The second light blocking layer 530 may include a material that blocks or absorbs light. In an embodiment, the second light blocking layer 530 may include a light blocking organic material. For example, in an embodiment the second light blocking layer 530 may include the same material as the first light blocking layer 510 described above.

In some embodiments, the refractive index of the second light blocking layer 530 may be less than the refractive index of the second light transmitting layer 540 described below. The refractive index of the second light blocking layer 530 may be greater than the refractive index of the second encapsulation film TFE2 of the thin film encapsulation layer TFEL. For example, in an embodiment the refractive index of the second light blocking layer 530 may be in a range of about 1.4 to about 1.55.

In an embodiment, for adjusting the refractive index, the second light blocking layer 530 may include an epoxy-based resin and/or an acryl-based resin containing fluorine (F), or may include silicon dioxide ($SiO_2$) and/or hollow silica. In an embodiment, the second light blocking layer 530 may have a thickness in a range of about 1 μm to about 2 μm.

The second light transmitting layer 540 may be disposed on the second light blocking layer 530. In an embodiment, the second light transmitting layer 540 may have a rectangular parallelepiped shape as shown in FIG. 7. However, embodiments of the present disclosure are not necessarily limited thereto. The second light transmitting layer 540 may fill (e.g., completely fill) the second openings OA2 of the second light blocking layer 530.

The second light transmitting layer 540 may transmit light emitted from the display panel 100. In an embodiment, the second light transmitting layer 540 may be an organic layer including a transparent organic material capable of transmitting light. For example, the second light transmitting layer 540 may include the same organic material as the first light transmitting layer 520 described above. However, embodiments of the present disclosure are not necessarily limited thereto. For example, in an embodiment, the second light transmitting layer 540 may be an inorganic layer capable of transmitting light.

The refractive index of the second light transmitting layer 540 may be greater than the refractive index of the second light blocking layer 530. The refractive index of the second light transmitting layer 540 may be greater than or equal to the refractive index of the third encapsulation film TFE3. For example, in an embodiment the difference between the refractive index of the second light transmitting layer 540 and the refractive index of the second light blocking layer 530 may be in a range of about 0.1 to about 0.15. The refractive index of the second light transmitting layer 540 may be in a range of about 1.55 to about 1.7. In an embodiment in which the second light transmitting layer 540 is an organic layer, nanoparticles such as zirconium oxide (ZrOx) and titanium oxide (TiOx) may be included to increase the refractive index. In an embodiment, the size of the nanoparticles may be within approximately 50 μm.

The third light blocking layer 550 may be disposed on the second light transmitting layer 540 (e.g., disposed directly thereon). The third light blocking layer 550 may be disposed on the display area DA of the display panel 100. In an embodiment, the third light blocking layer 550 may have a rectangular parallelepiped shape as shown in FIG. 7. However, embodiments of the present disclosure are not necessarily limited thereto. The shape of the third light blocking layer 550 may be the same as that of the second light blocking layer 530. The third light blocking layer 550 may overlap the plurality of touch electrodes REL and TEL in the third direction DR3. Since the third light blocking layer 550 and the plurality of touch electrodes REL and TEL are disposed not to overlap the emission area EA, the luminance and display quality of the display device 10 may be increased.

The third light blocking layer 550 may include third openings OA3. The third openings OA3 may transmit light emitted from the display panel 100. In an embodiment, the third openings OA3 may be disposed along the first direction DR1 and the second direction DR2. For example, the third openings OA3 may be arranged in a matrix form.

The length of each of the third openings OA3 in the first direction DR1 and the length thereof in the second direction DR2 may be substantially the same or different. The interval between the third openings OA3 in the first direction DR1 and the interval between the third openings OA3 in the second direction DR2 may be substantially the same or different.

In some embodiments, the third openings OA3 may overlap the pixels PX in the third direction DR3. In an embodiment, the sizes and shapes of the third openings OA3 may be the same as the sizes and shapes of the pixels PX, respectively. However, embodiments of the present disclosure are not necessarily limited thereto. The third openings OA3 may overlap the emission area EA.

In an embodiment, a third angle θ3 between the sidewalls of the third openings OA3 and the horizontal direction within the third opening OA3 may be in a range of about 90 degrees to about 110 degrees. In an embodiment in which the third angle θ3 is greater than or equal to about 90 degrees, light emitted from the display panel 100 is prevented from being reflected from the sidewalls of the third openings OA3 and proceeding toward the display panel 100 again, so that the front light emission efficiency may be increased. In an embodiment in which the third angle θ3 is about 110 degrees or less, light reflected from the sidewalls of the third openings OA3 is prevented from being blocked again by other light blocking layers additionally disposed thereon, so that the front light emission efficiency may be increased.

The third light blocking layer 550 may block or absorb light emitted from the display panel 100. The third light blocking layer 550 may include a material that blocks or absorbs light. In an embodiment, the third light blocking layer 550 may include a light blocking organic material. For example, in an embodiment the third light blocking layer 550 may include the same material as the first light blocking layer 510 described above.

In some embodiments, the refractive index of the third light blocking layer 550 may be less than the refractive index of the third light transmitting layer 560 described below. The refractive index of the third light blocking layer 550 may be greater than the refractive index of the second encapsulation layer TFE2 of the thin film encapsulation layer TFEL. For example, in an embodiment the refractive index of the third light blocking layer 550 may be in a range of about 1.4 to about 1.55.

In an embodiment, for adjusting the refractive index, the third light blocking layer 550 may include an epoxy-based resin and/or an acryl-based resin containing fluorine (F), or may include silicon dioxide ($SiO_2$) and/or hollow silica. In an embodiment, the third light blocking layer 550 may have a thickness in a range of about 1 μm to about 2 μm.

The third light transmitting layer 560 may be disposed on the third light blocking layer 550 (e.g., disposed directly thereon). The third light transmitting layer 560 may have a rectangular parallelepiped shape as shown in the drawing. However, embodiments of the present disclosure are not necessarily limited thereto. The third light transmitting layer 560 may fill (e.g, completely fill) the third openings OA3 of the third light blocking layer 550.

The third light transmitting layer 560 may transmit light emitted from the display panel 100. In an embodiment, the third light transmitting layer 560 may be an organic layer including a transparent organic material capable of transmitting light. For example, in an embodiment the third light transmitting layer 560 may include the same organic material as the first light transmitting layer 520 described above. However, embodiments of the present disclosure are not necessarily limited thereto. For example, in an embodiment, the third light transmitting layer 560 may be an inorganic layer capable of transmitting light.

The refractive index of the third light transmitting layer 560 may be greater than the refractive index of the third light blocking layer 550. For example, in an embodiment the difference between the refractive index of the third light transmitting layer 560 and the refractive index of the third light blocking layer 550 may be in a range of about 0.1 to about 0.15 The refractive index of the third light transmitting layer 560 may be in a range of about 1.55 to about 1.7. In an embodiment in which the third light transmitting layer 560 is an organic layer, nanoparticles such as zirconium oxide (ZrOx) and titanium oxide (TiOx) may be included to increase the refractive index. The size of the nanoparticles may be within approximately 50 μm.

In some embodiments, a width W1 of the first opening OA1, a width W2 of the second opening OA2, and a width W3 of the third opening OA3 may all be the same as each other. For example, in an embodiment each of the width W1 of the first opening OA1, the width W2 of the second opening OA2, and the width W3 of the third opening OA3 may be in a range of about 10 μm to about 20 μm.

In an embodiment, the refractive indices of the first light blocking layer 510, the second light blocking layer 530, and the third light blocking layer 550 may be the same as each other. The refractive indices of the first light transmitting layer 520, the second light transmitting layer 540, and the third light transmitting layer 560 may be the same as each other.

In some embodiments, the refractive indices of the first light transmitting layer 520, the second light transmitting layer 540, and the third light transmitting layer 560 may be greater than or equal to the refractive indices of the first encapsulation film TFE1 and the third encapsulation film TFE3 which are inorganic films. For example, in an embodiment the refractive indices of the first light transmitting layer 520, the second light transmitting layer 540, and the third light transmitting layer 560 may be greater than the refractive index of the second encapsulation film TFE2, which is an organic film.

In the display device 10 according to an embodiment of the present embodiment, the first touch insulating layer SIL1, the second touch insulating layer SIL2, the third touch insulating layer SIL3, the planarization layer PAS, the first light transmitting layer 520, the second light transmitting layer 540, and the third light transmitting layer 560 disposed on the thin film encapsulation layer TFE1 are formed of an inorganic layer having a high refractive index or a high-refractive organic layer, so that the viewing angle may be minimized, and at the same time, it is possible to increase the light emission efficiency in the third direction DR3 that is the front (top surface in the drawing) direction.

More specifically, referring to FIG. 8, transmitted light L1 may be light transmitted through the first opening OA1, the second opening OA2, and the third opening OA3 without being absorbed or blocked by the first light blocking layer 510, the second light blocking layer 530, and the third light blocking layer 550. Blocked light L2 may be light absorbed or blocked by the first light blocking layer 510, the second light blocking layer 530, and the third light blocking layer 550. In the present embodiment, the maximum range in which the transmitted light L1 may be emitted to the outside of the display device 10 may be a first range LR1.

Referring to FIG. 9, first transmitted light L1*a* may be emitted from the light emitting layer 172. The first transmitted light L1*a* may be refracted at a first point P1 on the interface between the first encapsulation film TFE1 and the second encapsulation film TFE2. Since the refractive index of the first encapsulation film TFEL is greater than the refractive index of the second encapsulation film TFE2, the refraction angle of the first transmitted light L1*a* may be greater than the incident angle. The first transmitted light L1*a* passing through the second encapsulation film TFE2 may be refracted at a second point P2 on the interface between the second encapsulation film TFE2 and the third encapsulation film TFE3. Since the refractive index of the second encapsulation film TFE2 is lower than the refractive index of the third encapsulation film TFE3, the refraction angle of the first transmitted light L1*a* may be less than the incident angle. The refractive indices of the first touch insulating layer SIL1, the second touch insulating layer SIL2, the third touch insulating layer SIL3, the planarization layer PAS, the first light transmitting layer 520, the second light transmitting layer 540, and the third light transmitting layer 560 disposed on the third encapsulation film TFE3 are greater than or equal to the refractive index of the third encapsulation film TFE3, so that the first transmitted light L1*a* passing through the third encapsulation film TFE3 may travel straight without further refraction, or may be bent toward the front direction or the third direction DR3 and emitted to the outside. Accordingly, the front light emission efficiency may be increased.

In an embodiment, second transmitted light L1*b* may be emitted from the light emitting layer 172. The second transmitted light L1*b* may be refracted at a third point P3 on the interface between the first encapsulation film TFEL and the second encapsulation film TFE2. Since the refractive index of the first encapsulation film TFEL is greater than the refractive index of the second encapsulation film TFE2, the refraction angle of the second transmitted light L1*b* may be greater than the incident angle. The second transmitted light L1*b* passing through the second encapsulation film TFE2 may be refracted at a fourth point P4 on the interface between the second encapsulation film TFE2 and the third encapsulation film TFE3 Since the refractive index of the second encapsulation film TFE2 is lower than the refractive index of the third encapsulation film TFE3, the refraction angle of the second transmitted light L1*b* may be less than the incident angle. The second transmitted light L1*b* passing through the touch sensor layer TSU may be reflected from an outer wall of any one of the first light blocking layer 510, the second light blocking layer 530, and the third light blocking layer 550. The refractive indices of the first light blocking layer 510, the second light blocking layer 530, and the third light blocking layer 550 are less than the refractive indices of the first light transmitting layer 520, the second light transmitting layer 540, and the third light transmitting layer 560, so that the second transmitted light L1*b* may be reflected from the outer wall of any one of the first light blocking layer 510, the second light blocking layer 530, and the third light blocking layer 550 by total reflection. Accordingly, some light such as the second transmitted light L1*b* is not absorbed by the first light blocking layer 510, the second light blocking layer 530, and the third light blocking layer 550 and is emitted to the outside, so that the front light emission efficiency may be increased.

However, embodiments of the present disclosure are not necessarily limited thereto. For example, even in an embodiment in which any one of the first touch insulating layer SIL1, the second touch insulating layer SIL2, the third touch insulating layer SIL3, the planarization layer PAS, the first light transmitting layer 520, the second light transmitting layer 540, and the third light transmitting layer 560 disposed on the thin film encapsulation layer TFEL is omitted, the same effect may be achieved.

Hereinafter, embodiments of the display device will be described. In the following embodiments, description of the same components as those of the above-described embodiment, which are denoted by like reference numerals, may be omitted or simplified for economy of description, and differences will be mainly described.

Figure 10:
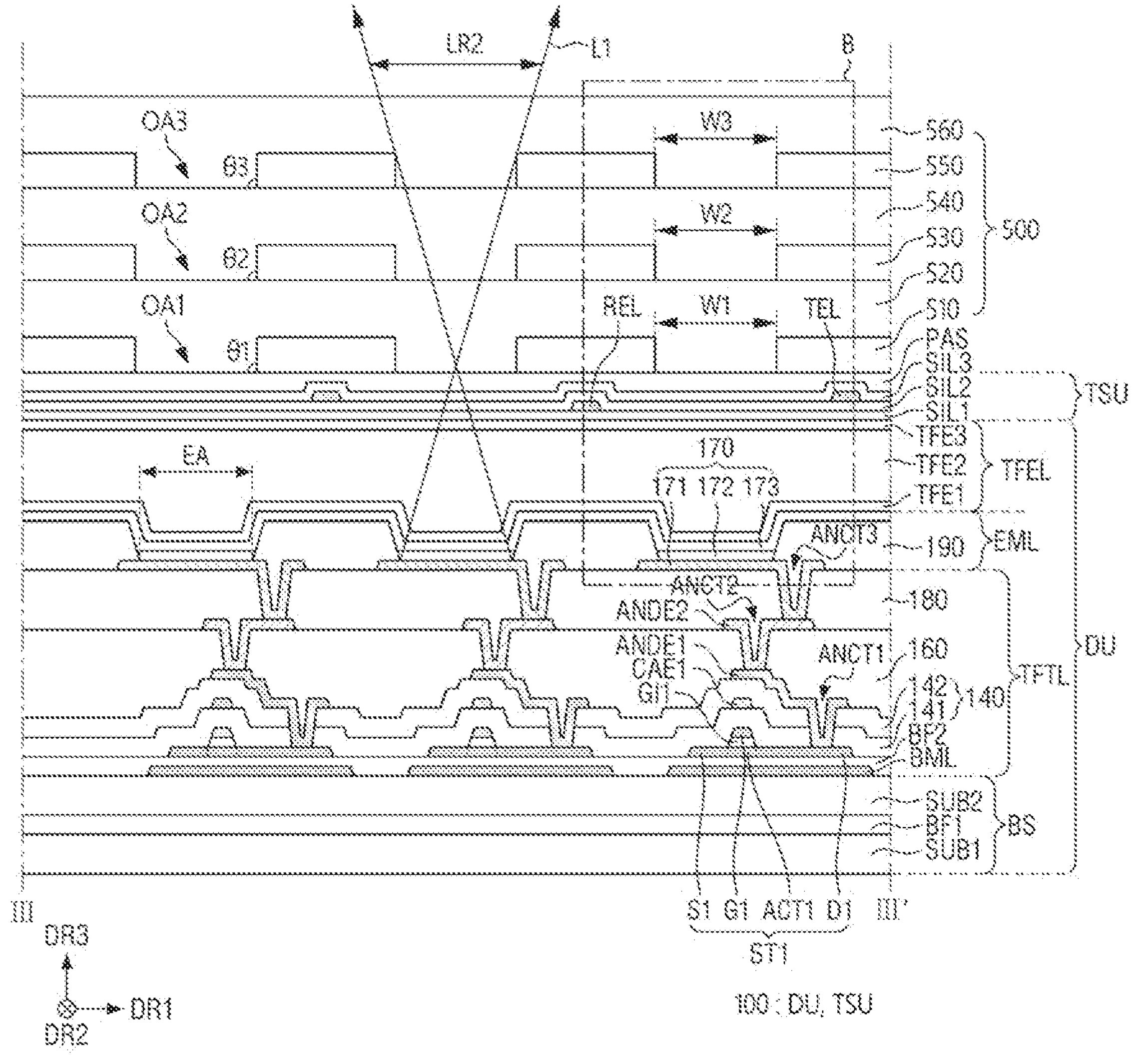
FIG. 10 is a cross-sectional view of a display panel and a light control layer taken along line III-III' of FIG. 7 according to an embodiment of the present disclosure.
Figure 11:
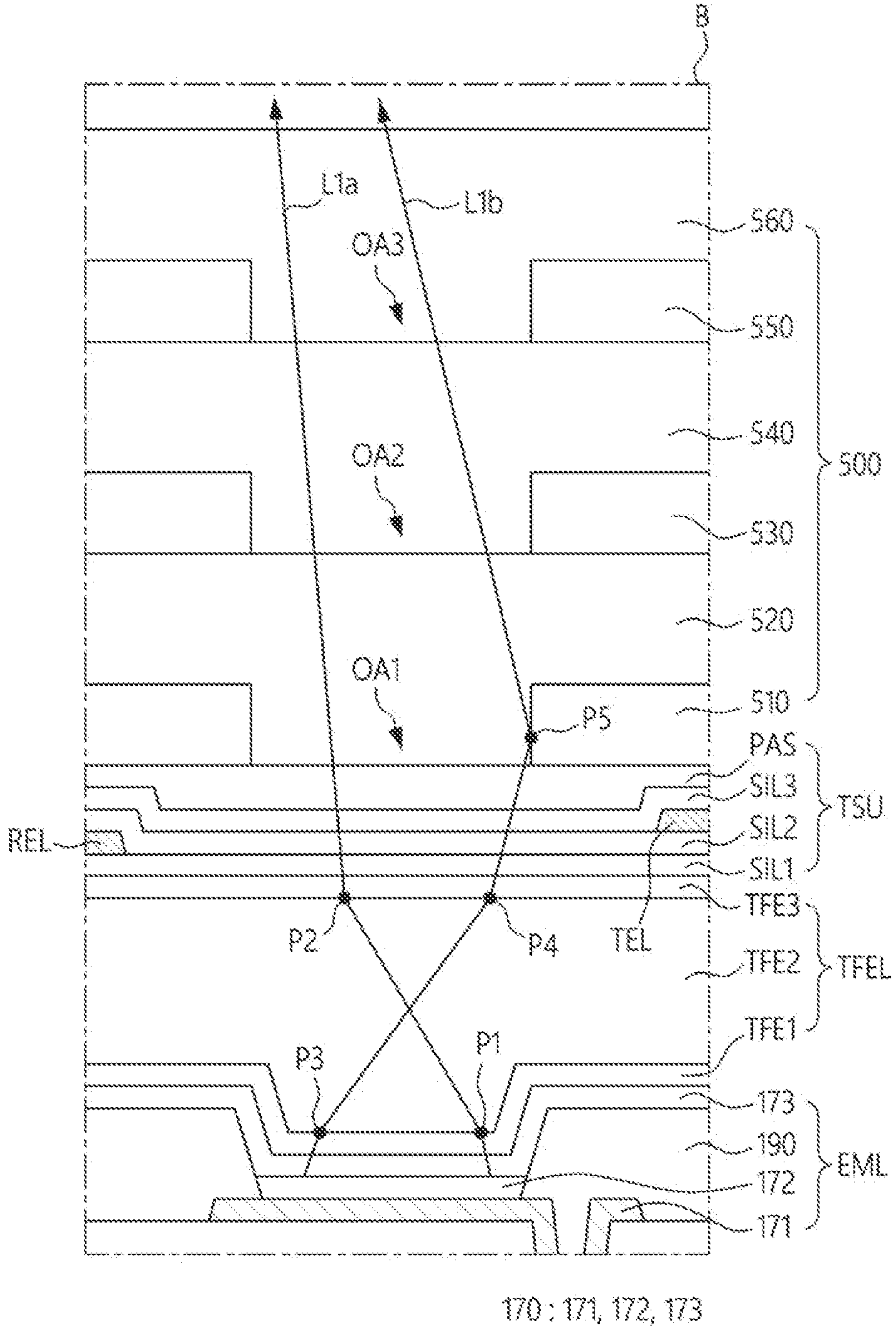
FIG. 11 is an enlarged view of region B of FIG. 10 according to an embodiment of the present disclosure.

FIG. 10 is a cross-sectional view of a display panel and a light control layer according to an embodiment. FIG. 11 is an enlarged view of part B of FIG. 10.

Referring to FIGS. 10 and 11, the display device 10 according to an embodiment is different from the display device 10 described with reference to FIG. 8 and the like in that the first angle θ1, a second angle θ2, and a third angle θ3 are about 90 degrees.

More specifically, in the display device 10 according to an embodiment, the first angle θ1 of the first opening OA1, the second angle θ2 of the second opening OA2, and the third angle θ3 of the third opening OA3 may be about 90 degrees.

Accordingly, a width W1 of the first opening OA1, a width W2 of the second opening OA2, and a width W3 of the third opening OA3 are maintained in the same manner as in the display device 10 according to an embodiment described with reference to FIG. 8 and the like, but a second range LR2, which is the maximum range in which the transmitted light L1 may be emitted to the outside of the display device 10, may be less than the first range LR1.

In the display device 10 according to an embodiment shown in FIG. 11, by maintaining the width W1 of the first opening OA1, the width W2 of the second opening OA2, and the width W3 of the third opening OA3 as they are, the front transmission efficiency may be maintained, but the viewing angle may be minimized by reducing the second range LR2.

Referring to FIG. 11, as the first angle θ1, the second angle θ2, and the third angle θ3 become about 90 degrees, the second transmitted light L1*b* may be reflected in a direction toward the inside of the opening compared to the second transmitted light L1*b* of the display device 10 according to an embodiment described with reference to FIG. 8 and the like.

For example, in the display device 10 according to an embodiment described with reference to FIG. 8, since the reflective surfaces, which are sidewalls of the openings OA1, OA2, and OA3, are relatively inclined surfaces, some of the second transmitted light L1*b* may be reflected towards the second light blocking layer 530 and blocked by the second light blocking layer 530. On the other hand, in the display device 10 according to the present embodiment, since the reflective surfaces, which are the sidewalls of the openings OA1, OA2, and OA3, are vertical surfaces, the second transmitted light L1*b* may be reflected in a direction towards the inside of the openings OA1, OA2, and OA3 and may not be blocked by the second light blocking layer 530.

Figure 12:
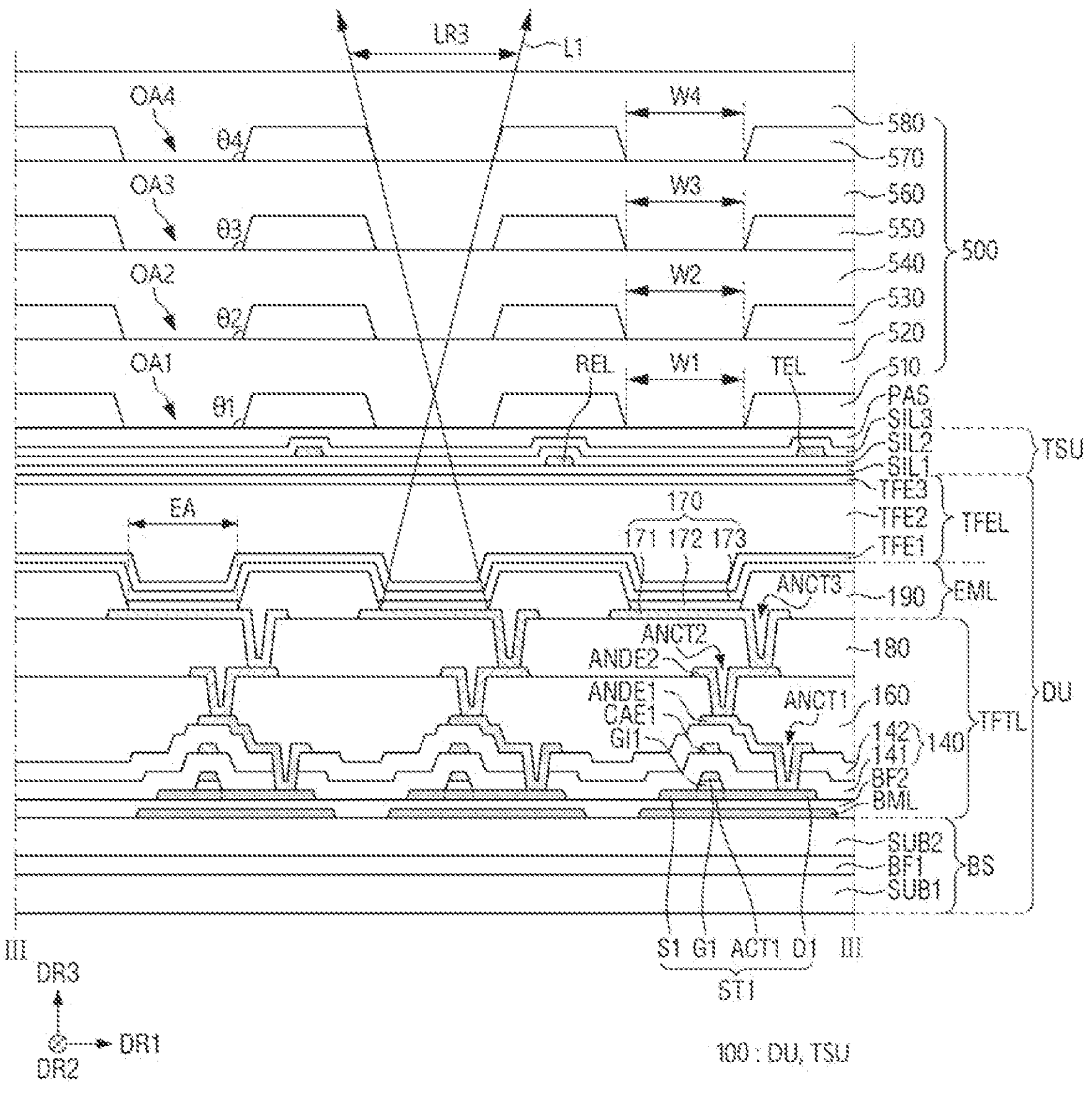
FIG. 12 is a cross-sectional view of a display panel and a light control layer taken along line III-III' of FIG. 7 according to an embodiment of the present disclosure.

FIG. 12 is a cross-sectional view of a display panel and a light control layer according to an embodiment.

Referring to FIG. 12, the display device 10 according to an embodiment is different from the display device 10 according to an embodiment described with reference to FIG. 8 and the like in that a fourth light blocking layer 570 and a fourth light transmitting layer 580 are further included.

More specifically, the light control layer 500 may further include the fourth light blocking layer 570 and the fourth light transmitting layer 580.

The fourth light blocking layer 570 may be disposed on the third light transmitting layer 560 (e.g., disposed directly thereon). The fourth light blocking layer 570 may be disposed on the display area DA of the display panel 100. In an embodiment, the fourth light blocking layer 570 may have a rectangular parallelepiped shape. However, embodiments of the present disclosure are not necessarily limited thereto. In an embodiment, the shape of the fourth light blocking layer 570 may be the same as that of the third light blocking layer 550. The fourth light blocking layer 570 may overlap the plurality of touch electrodes REL and TEL in the third direction DR3. Since the fourth light blocking layer 570 and the plurality of touch electrodes REL and TEL are disposed not to overlap the emission area EA, the luminance and display quality of the display device 10 may be increased.

The fourth light blocking layer 570 may include fourth openings OA4. The fourth openings OA4 may transmit light emitted from the display panel 100. In an embodiment, the fourth openings OA4 may be disposed along the first direction DR1 and the second direction DR2. For example, the fourth openings OA4 may be arranged in a matrix form.

The length of each of the fourth openings OA4 in the first direction DR1 and the length thereof in the second direction DR2 may be substantially the same or different. The interval between the fourth openings OA4 in the first direction DR1 and the interval between the fourth openings OA4 in the second direction DR2 may be substantially the same or different.

In some embodiments, the fourth openings OA4 may overlap the pixels PX in the third direction DR3. In an embodiment, the sizes and shapes of the fourth openings OA4 may be the same as the sizes and shapes of the pixels PX, respectively. However, embodiments of the present disclosure are not necessarily limited thereto. The fourth openings OA4 may overlap the emission area EA.

A fourth angle θ4 between the sidewalls of the fourth openings OA4 and the horizontal direction within the fourth opening OA4 may be in a range of about 90 degrees to about 110 degrees. In an embodiment in which the fourth angle θ4 is greater than or equal to about 90 degrees, light emitted from the display panel 100 is prevented from being reflected from the sidewalls of the fourth openings OA4 and proceeding toward the display panel 100 again, so that the front light emission efficiency may be increased. In an embodiment in which the fourth angle θ4 is about 110 degrees or less, light reflected from the sidewalls of the fourth openings OA4 is prevented from being blocked again by other light blocking layers additionally disposed thereon, so that the front light emission efficiency may be increased.

The fourth light blocking layer 570 may block or absorb light emitted from the display panel 100. The fourth light blocking layer 570 may include a material that blocks or absorbs light. In an embodiment, the fourth light blocking layer 570 may include a light blocking organic material. For example, in an embodiment the fourth light blocking layer 570 may include the same material as the first light blocking layer 510 described above.

In some embodiments, the refractive index of the fourth light blocking layer 570 may be less than the refractive index of the fourth light transmitting layer 580 described below. The refractive index of the fourth light blocking layer 570 may be greater than the refractive index of the second encapsulation film TFE2 of the thin film encapsulation layer TFEL. For example, in an embodiment the refractive index of the fourth light blocking layer 570 may be in a range of about 1.4 to about 1.55.

In an embodiment, for adjusting the refractive index, the fourth light blocking layer 570 may include an epoxy-based resin and/or an acryl-based resin containing fluorine (F), or may include silicon dioxide ($SiO_2$) and/or hollow silica. In an embodiment, the fourth light blocking layer 570 may have a thickness in a range of about 1 μm to about 2 μm.

The fourth light transmitting layer 580 may be disposed on the fourth light blocking layer 570 (e.g., disposed directly thereon). In an embodiment, the fourth light transmitting layer 580 may have a rectangular parallelepiped shape as shown in FIG. 12. However, embodiments of the present disclosure are not necessarily limited thereto. The fourth light transmitting layer 580 may fill (e.g., completely fill) the fourth openings OA4 of the fourth light blocking layer 570.

The fourth light transmitting layer 580 may transmit light emitted from the display panel 100. In an embodiment, the fourth light transmitting layer 580 may be an organic layer including a transparent organic material capable of transmitting light. For example, in an embodiment the fourth light transmitting layer 580 may include the same organic material as the first light transmitting layer 520 described above. However, embodiments of the present disclosure are not necessarily limited thereto. For example, in an embodiment, the fourth light transmitting layer 580 may be an inorganic layer capable of transmitting light. For example, the fourth light transmitting layer 580 may include the same inorganic material as the first light transmitting layer 520 described above.

The refractive index of the fourth light transmitting layer 580 may be greater than the refractive index of the fourth light blocking layer 570. For example, in an embodiment the difference between the refractive index of the fourth light transmitting layer 580 and the refractive index of the fourth light blocking layer 570 may be in a range of about 0.1 to about 0.15. The refractive index of the fourth light transmitting layer 580 may be in a range of about 1.55 to about 1.7. In an embodiment in which the fourth light transmitting layer 580 is an organic layer, nanoparticles such as zirconium oxide (ZrOx) and titanium oxide (TiOx) may be included to increase the refractive index. In an embodiment, the size of the nanoparticles may be within approximately 50 μm.

In some embodiments, a width W1 of the first opening OA1, a width W2 of the second opening OA2, a width W3 of the third opening OA3, and a width of the fourth opening OA4 may all be the same. For example, in an embodiment each of the width W1 of the first opening OA1, the width W2 of the second opening OA2, the width W3 of the third opening OA3, and the width of the fourth opening OA4 may be in a range of about 10 μm to about 20 μm.

In an embodiment, the refractive indices of the first light blocking layer 510, the second light blocking layer 530, the third light blocking layer 550, and the fourth light blocking layer 570 may be the same as each other. The refractive indices of the first light transmitting layer 520, the second light transmitting layer 540, the third light transmitting layer 560, and the fourth light transmitting layer 580 may be the same as each other.

In some embodiments, the refractive index of the fourth light transmitting layer 580 may be greater than or equal to the refractive indices of the first encapsulation film TFEL and the third encapsulation film TFE3, which are inorganic films. For example, the refractive index of the fourth light transmitting layer 580 may be greater than the refractive index of the second encapsulation film TFE2, which is an organic film.

In the display device 10 according to an embodiment, the first touch insulating layer SIL1, the second touch insulating layer SIL2, the third touch insulating layer SIL3, the planarization layer PAS, the first light transmitting layer 520, the second light transmitting layer 540, the third light transmitting layer 560, and the fourth light transmitting layer 580 disposed on the thin film encapsulation layer TFE1 are formed of an inorganic layer having a high refractive index or a high-refractive organic layer, so that the viewing angle may be minimized, and at the same time, it is possible to increase the light emission efficiency in the third direction DR3 that is the front (e.g., top surface in the drawing) direction.

More specifically, referring to FIG. 12, by making a width W4 of a fourth opening OA4 the same as the width W1 of the first opening OA1, the width W2 of the second opening OA2, and the width W3 of the third opening OA3, the front light emission efficiency is maintained as it is, but the third range LR3, which is the maximum range in which the transmitted light L1 may be emitted to the outside of the display device 10, may be less than the first range LR1 in the display device 10 according to an embodiment.

Although FIG. 12 illustrates the four light blocking layers 510, 530, 550, and 570, the stacked number of the light blocking layers 510, 530, 550, and 570 is not necessarily limited thereto. The stacked number of the light blocking layers 510, 530, 550, and 570 may be appropriately set in consideration of the viewing angle and the front light emission efficiency.

The display device 10 according to an embodiment may maintain the light emission efficiency, but may minimize the viewing angle by adjusting the stacked number of the light blocking layers 510, 530, 550, and 570.

Figure 13:
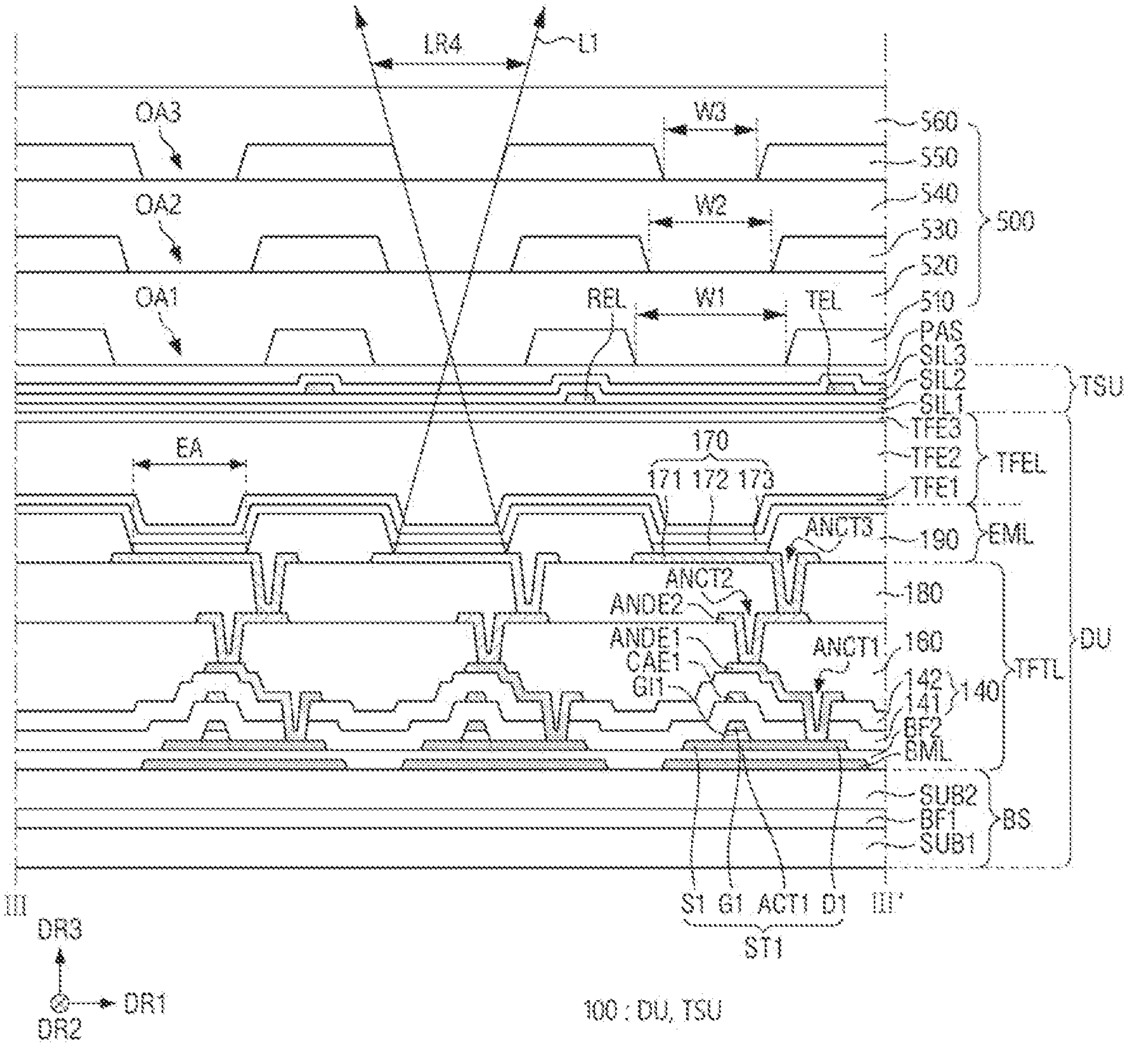
FIG. 13 is a cross-sectional view of a display panel and a light control layer taken along line III-III' of FIG. 7 according to an embodiment of the present disclosure.

FIG. 13 is a cross-sectional view of a display panel and a light control layer according to an embodiment.

Referring to FIG. 13, the display device 10 according to an embodiment is different from the display device 10 according to an embodiment described with reference to FIG. 8 and the like in that the width W1 of the first opening OA1 is greater than the width W2 of the second opening OA2, and the width W2 of the second opening OA2 is greater than the width W3 of the third opening OA3.

More specifically, the width W1 of the first opening OA1 may be greater than the width W2 of the second opening OA2, and the width W2 of the second opening OA2 may be greater than the width W3 of the third opening OA3.

For example, the width W1 of the first opening OA1 in the first direction DR1 may be greater than the width W2 of the second opening OA2 in the first direction DR1 and the width W3 of the third opening OA3 in the first direction DR1. The width W2 of the second opening OA2 in the first direction DR1 may be greater than the width W3 of the third opening OA3 in the first direction DR1.

The width W1 of the first opening OA1 in the second direction DR2 may be greater than the width W2 of the second opening OA2 in the second direction DR2 and the width W3 of the third opening OA3 in the second direction DR2. The width W2 of the second opening OA2 in the second direction DR2 may be greater than the width W3 of the third opening OA3 in the second direction DR2.

Accordingly, a fourth range LR4, which is the maximum range in which the transmitted light L1 may be emitted to the outside of the display device 10, may be less than the first range LR1 in the display device 10 according to an embodiment. Accordingly, the display device 10 according to an embodiment may minimize the viewing angle.

Figure 14:
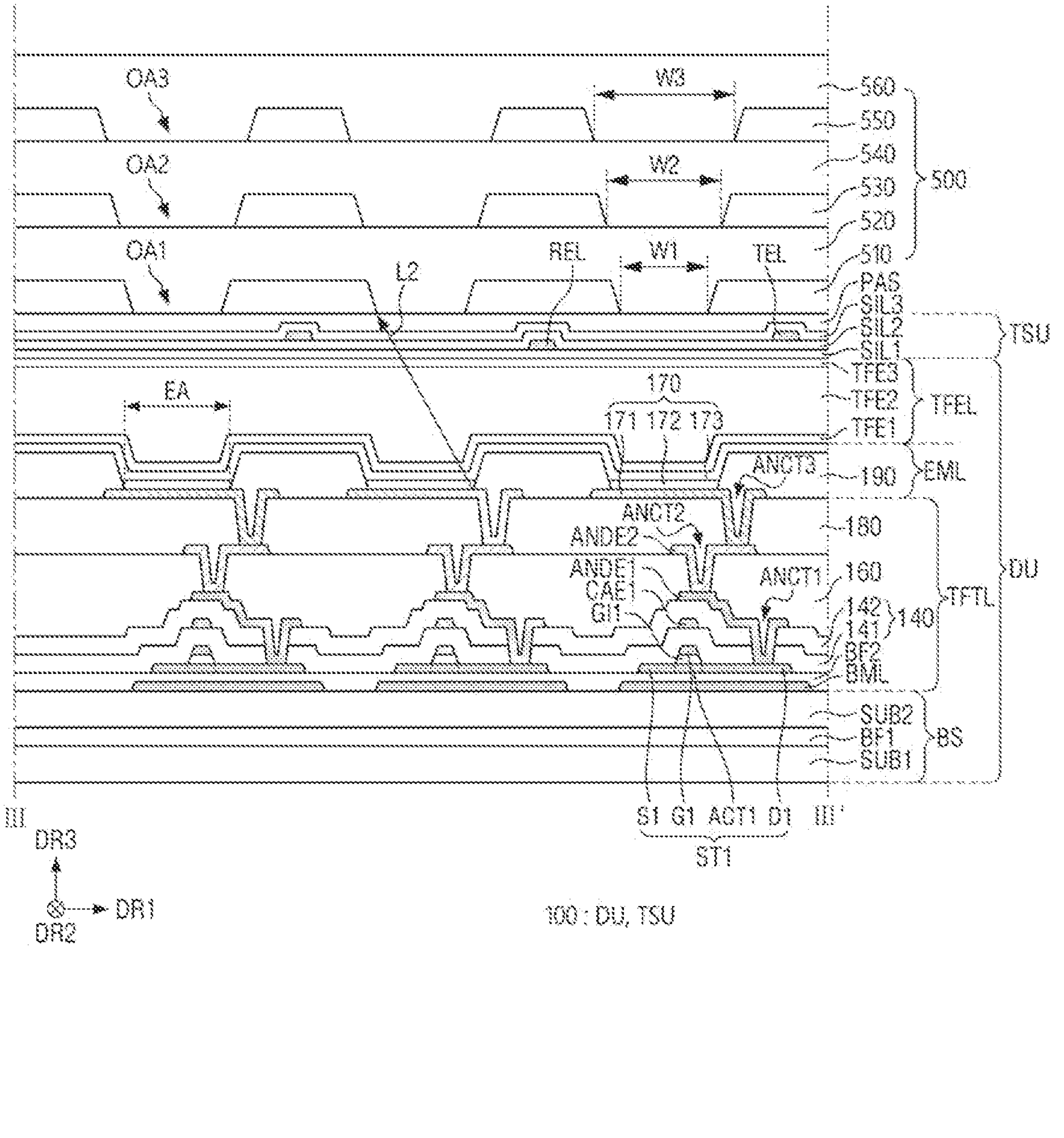
FIG. 14 is a cross-sectional view of a display panel and a light control layer taken along line III-III' of FIG. 7 according to an embodiment of the present disclosure.

FIG. 14 is a cross-sectional view of a display panel and a light control layer according to an embodiment.

Referring to FIG. 14, the display device 10 according to an embodiment is different from the display device 10 according to an embodiment described with reference to FIG. 8 and the like in that the width W3 of the third opening OA3 is greater than the width W2 of the second opening OA2, and the width W2 of the second opening OA2 is greater than the width W1 of the first opening OA1.

More specifically, the width W3 of the third opening OA3 may be greater than the width W2 of the second opening OA2, and the width W2 of the second opening OA2 may be greater than the width W1 of the first opening OA1.

For example, the width W3 of the third opening OA3 in the first direction DR1 may be greater than the width W2 of the second opening OA2 in the first direction DR1 and the width W1 of the first opening OA1 in the first direction DR1. The width W2 of the second opening OA2 in the first direction DR1 may be greater than the width W1 of the first opening OA1 in the first direction DR1.

The width W3 of the third opening OA3 in the second direction DR2 may be greater than the width W2 of the second opening OA2 in the second direction DR2 and the width W1 of the first opening OA1 in the second direction DR2. The width W2 of the second opening OA2 in the second direction DR2 may be greater than the width W1 of the first opening OA1 in the second direction DR2.

Accordingly, the range of the blocked light L2 blocked by the first light blocking layer 510 may be increased. Accordingly, a range in which light beyond a certain viewing angle is blocked is widened, so that the viewing angle may be minimized.

Figure 15:
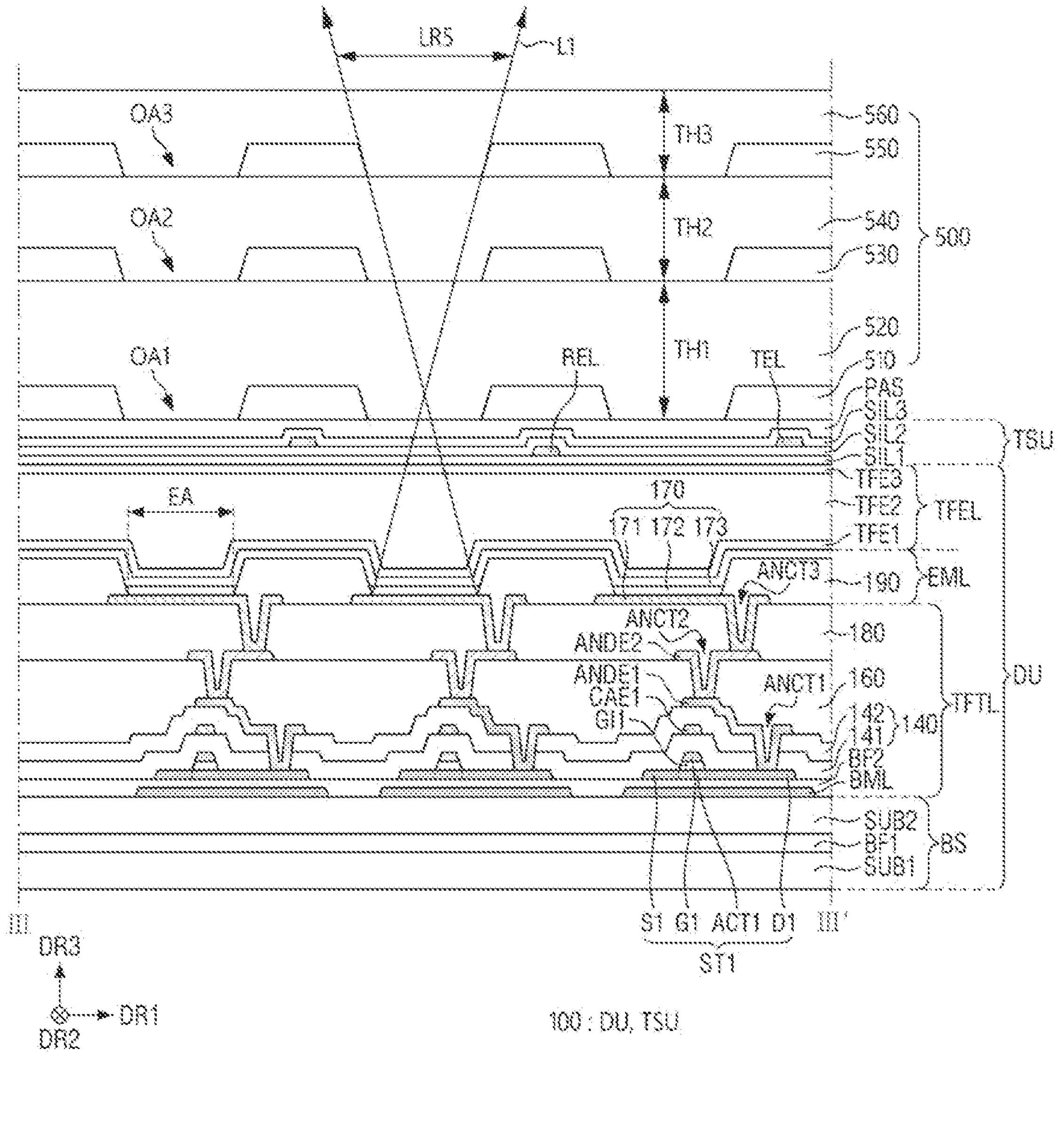
FIG. 15 is a cross-sectional view of a display panel and a light control layer taken along line III-III' of FIG. 7 according to an embodiment of the present disclosure.

FIG. 15 is a cross-sectional view of a display panel and a light control layer according to an embodiment.

Referring to FIG. 15, the display device 10 according to an embodiment is different from the display device 10 according to an embodiment described with reference to FIG. 8 and the like in that a thickness TH1 of the first light transmitting layer 520 is greater than a thickness TH2 of the second light transmitting layer 540, and the thickness TH2 of the second light transmitting layer 540 is greater than a thickness TH3 of the third light transmitting layer 560.

More specifically, the thickness TH1 of the first light transmitting layer 520, the thickness TH2 of the second light transmitting layer 540, and the thickness TH1 of the third light transmitting layer 560 may be different from each other. For example, the thickness TH1 of the first light transmitting layer 520 may be greater than the thickness TH2 of the second light transmitting layer 540, and the thickness TH2 of the second light transmitting layer 540 may be greater than the thickness TH3 of the third light transmitting layer 560.

In an embodiment shown in FIG. 15, the thickness TH1 of the first light transmitting layer 520 is greater than the thickness TH2 of the second light transmitting layer 540, and the thickness TH2 of the second light transmitting layer 540 is greater than the thickness TH3 of the third light transmitting layer 560. However, embodiments of the present disclosure are not necessarily limited thereto.

In an embodiment, the thickness TH3 of the third light transmitting layer 560 may be greater than the thickness TH2 of the second light transmitting layer 540, and the thickness TH2 of the second light transmitting layer 540 may be greater than the thickness TH1 of the first light transmitting layer 520. Alternatively, the thickness TH1 of the first light transmitting layer 520 may be greater than the thickness TH3 of the third light transmitting layer 560, and the thickness TH3 of the third light transmitting layer 560 may be greater than the thickness TH2 of the second light transmitting layer 540. Alternatively, the thickness TH3 of the third light transmitting layer 560 may be greater than the thickness TH1 of the first light transmitting layer 520, and the thickness TH1 of the first light transmitting layer 520 may be greater than the thickness TH2 of the second light transmitting layer 540. Alternatively, the thickness TH2 of the second light transmitting layer 540 may be greater than the thickness TH1 of the first light transmitting layer 520, and the thickness TH1 of the first light transmitting layer 520 may be greater than the thickness TH3 of the third light transmitting layer 560. Alternatively, the thickness TH2 of the second light transmitting layer 540 may be greater than the thickness TH3 of the third light transmitting layer 560, and the thickness TH3 of the third light transmitting layer 560 may be greater than the thickness TH1 of the first light transmitting layer 520.

In the display device 10 according to an embodiment shown in FIG. 15, by adjusting the thicknesses of the first light transmitting layer 520, the second light transmitting layer 540, and the third light transmitting layer 560, a fifth range LR5, which is the maximum range in which the transmitted light L1 may be emitted to the outside of the display device 10, may be less than the first range LR1 of the display device 10 described with reference to FIG. 8 and the like. Accordingly, the front transmission efficiency may be maintained, but the viewing angle may be minimized by reducing the fifth range LR5.

Hereinafter, a method of manufacturing a display device according to an embodiment will be described.

Figure 16:
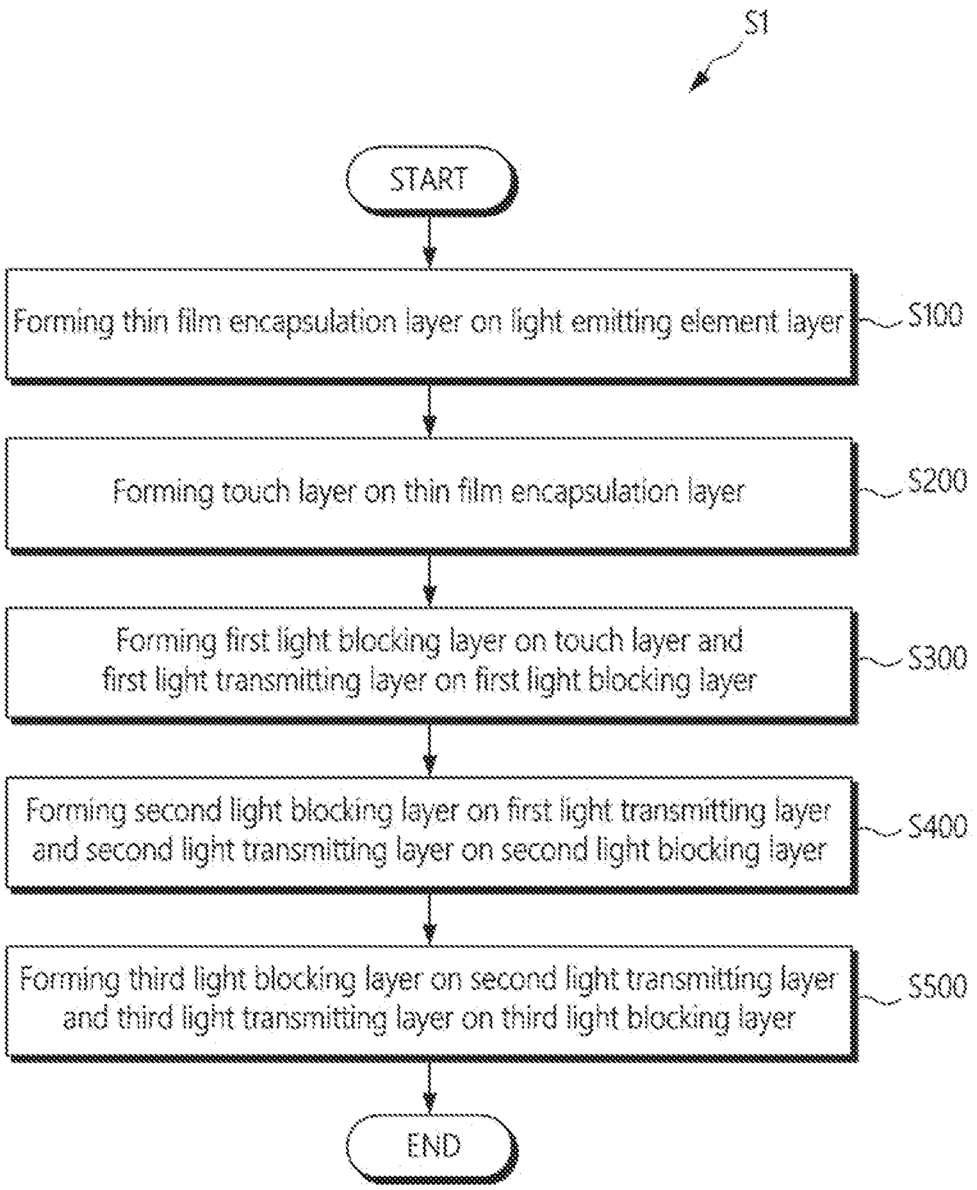
FIG. 16 is a flowchart showing a method for manufacturing a display device according to an embodiment of the present disclosure.
Figure 17:
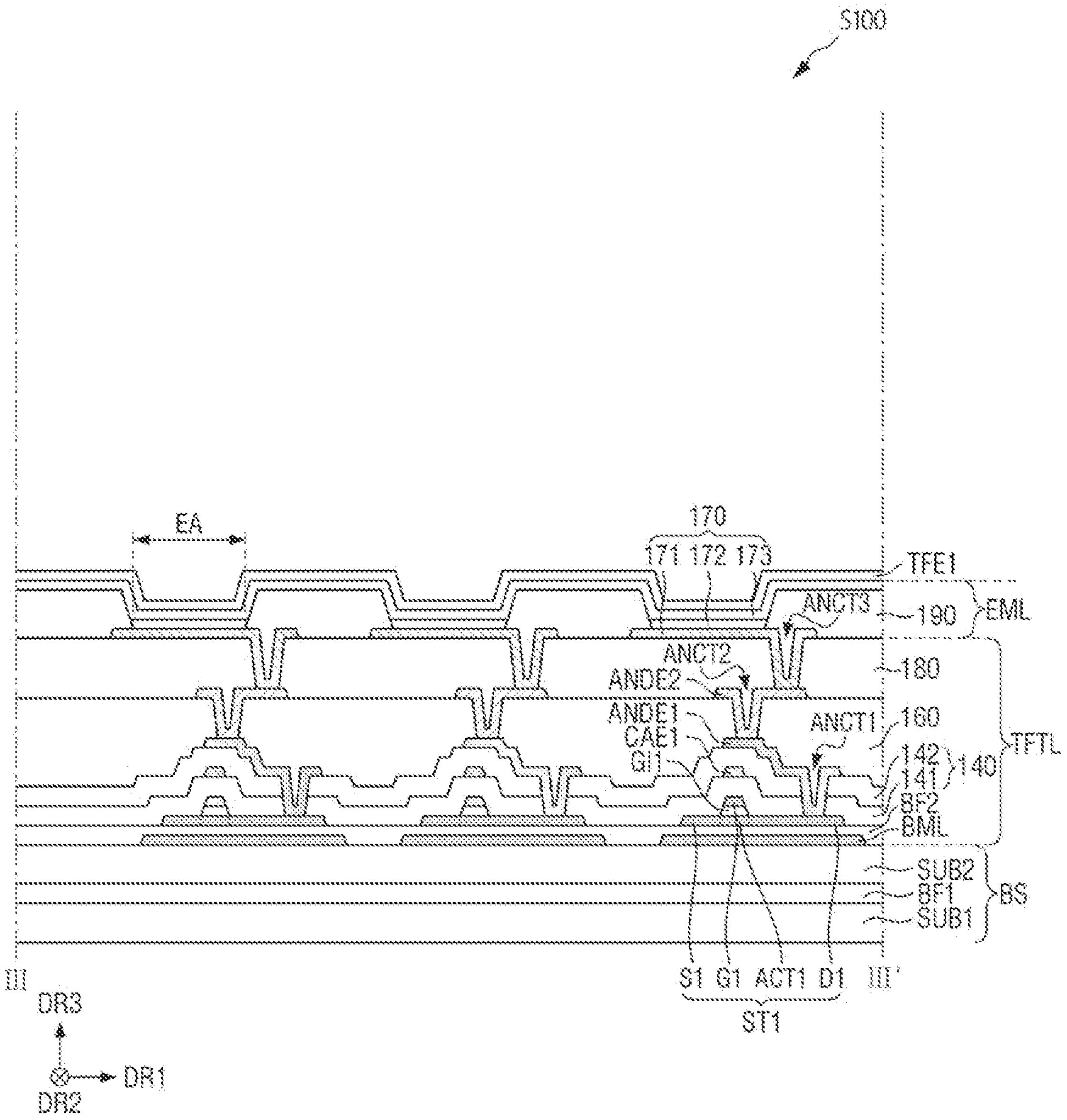
FIGS. 17 to 19 are cross-sectional views showing step S100 of FIG. 16 taken along line III-III' of FIG. 7 according to embodiments of the present disclosure.
Figure 18:
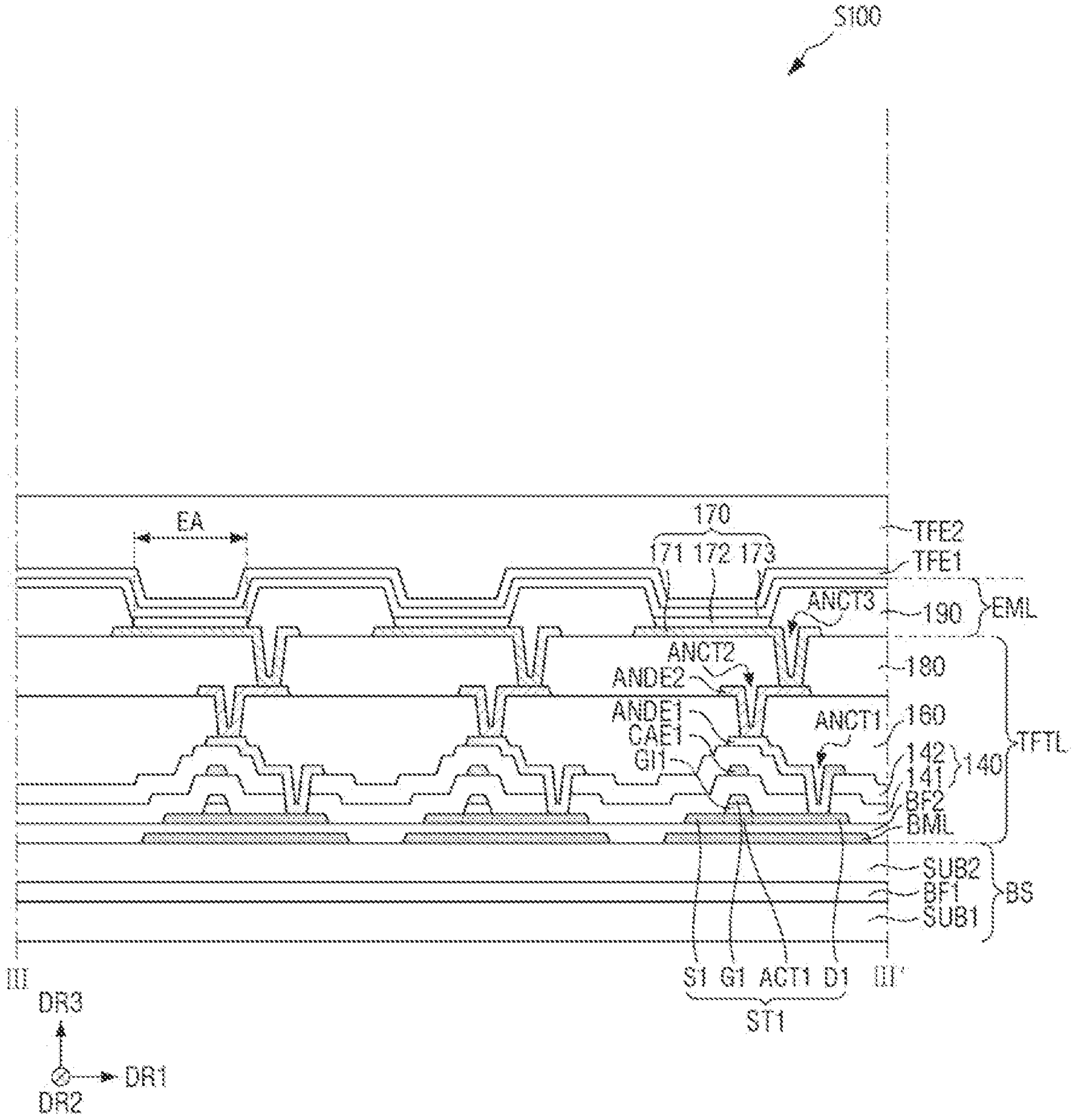
Figure 19:
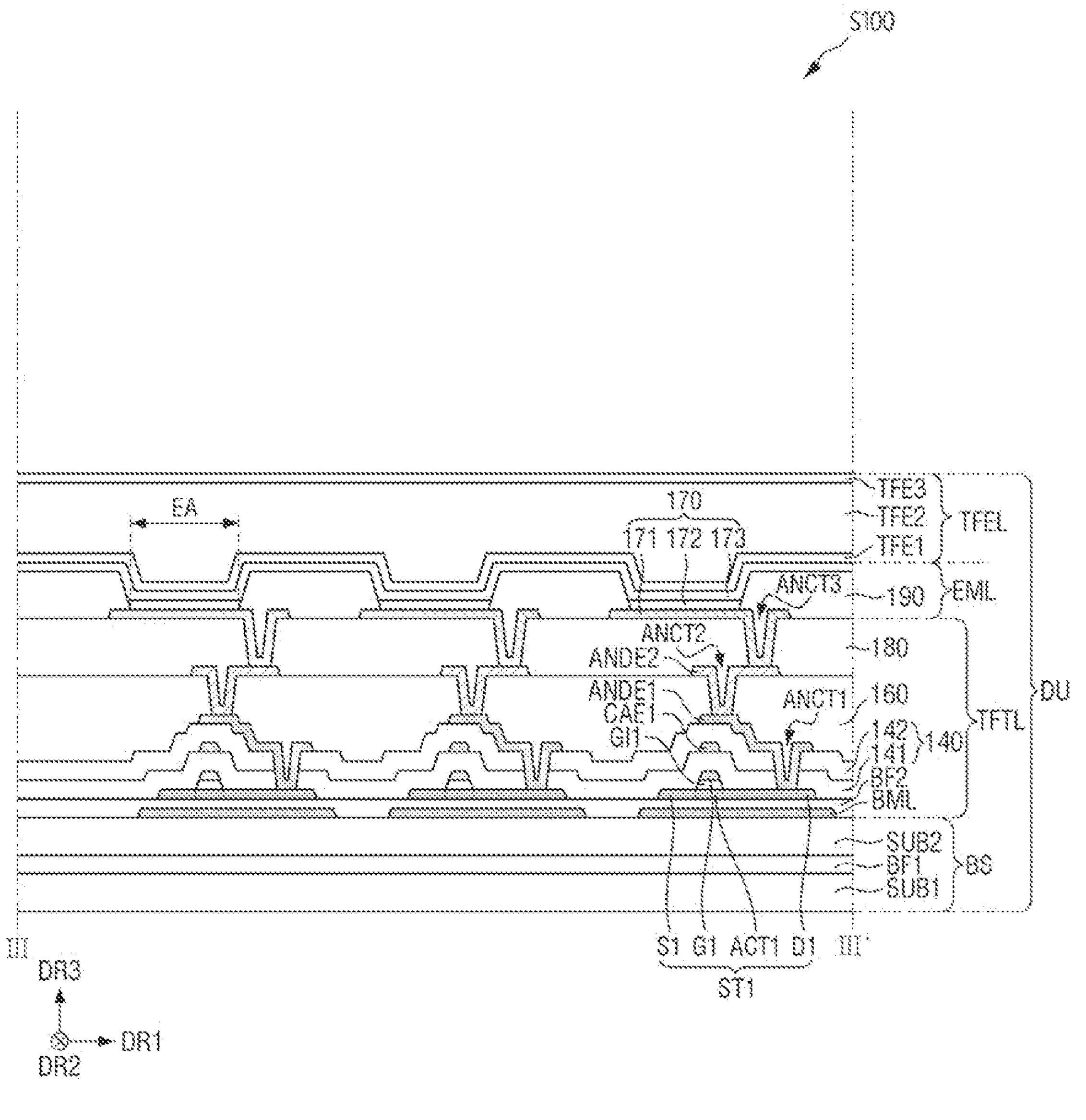
Figure 20:
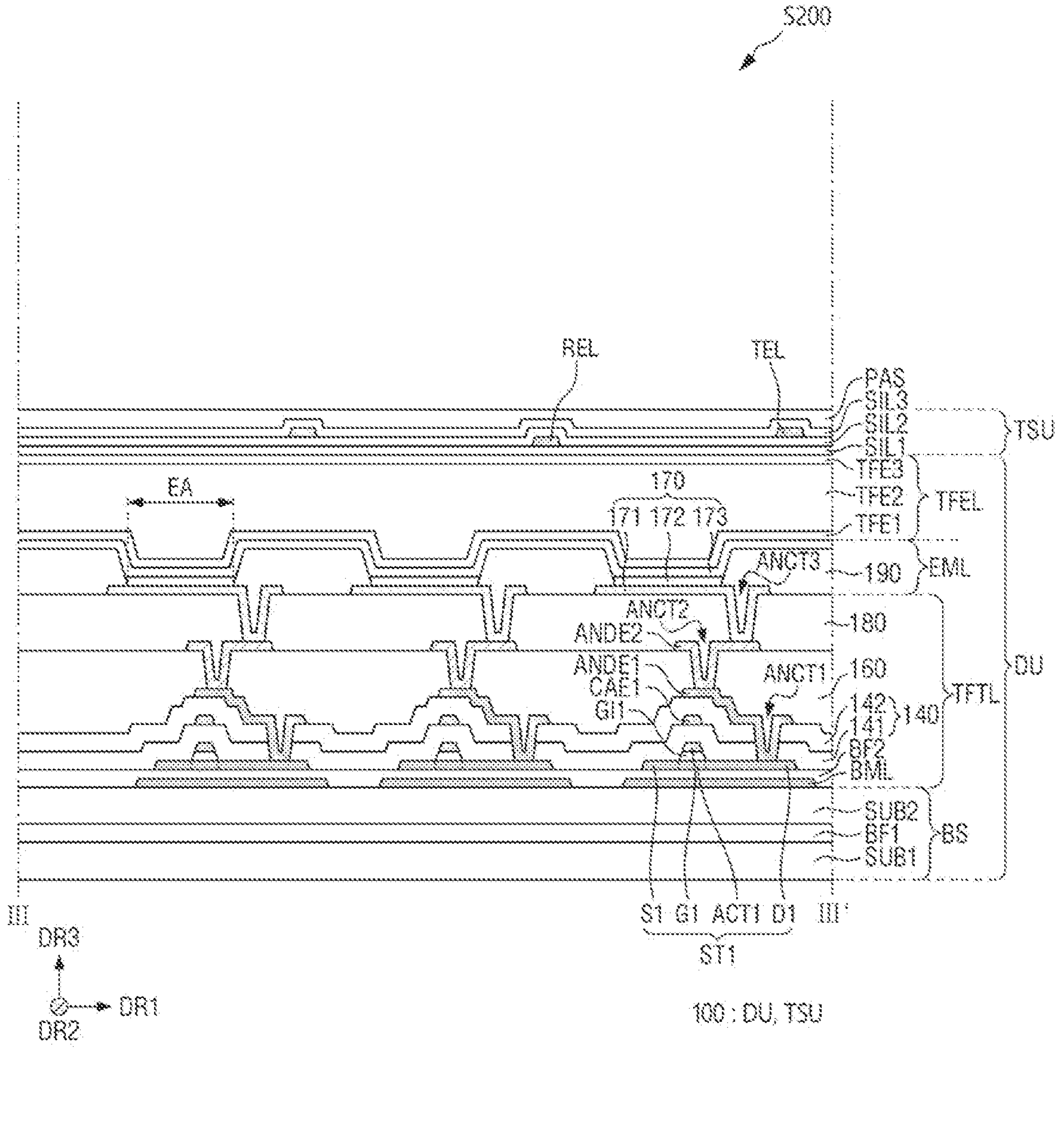
FIG. 20 is a cross-sectional view showing step S200 of FIG. 16 taken along line III-III' of FIG. 7 according to embodiments of the present disclosure.
Figure 21:
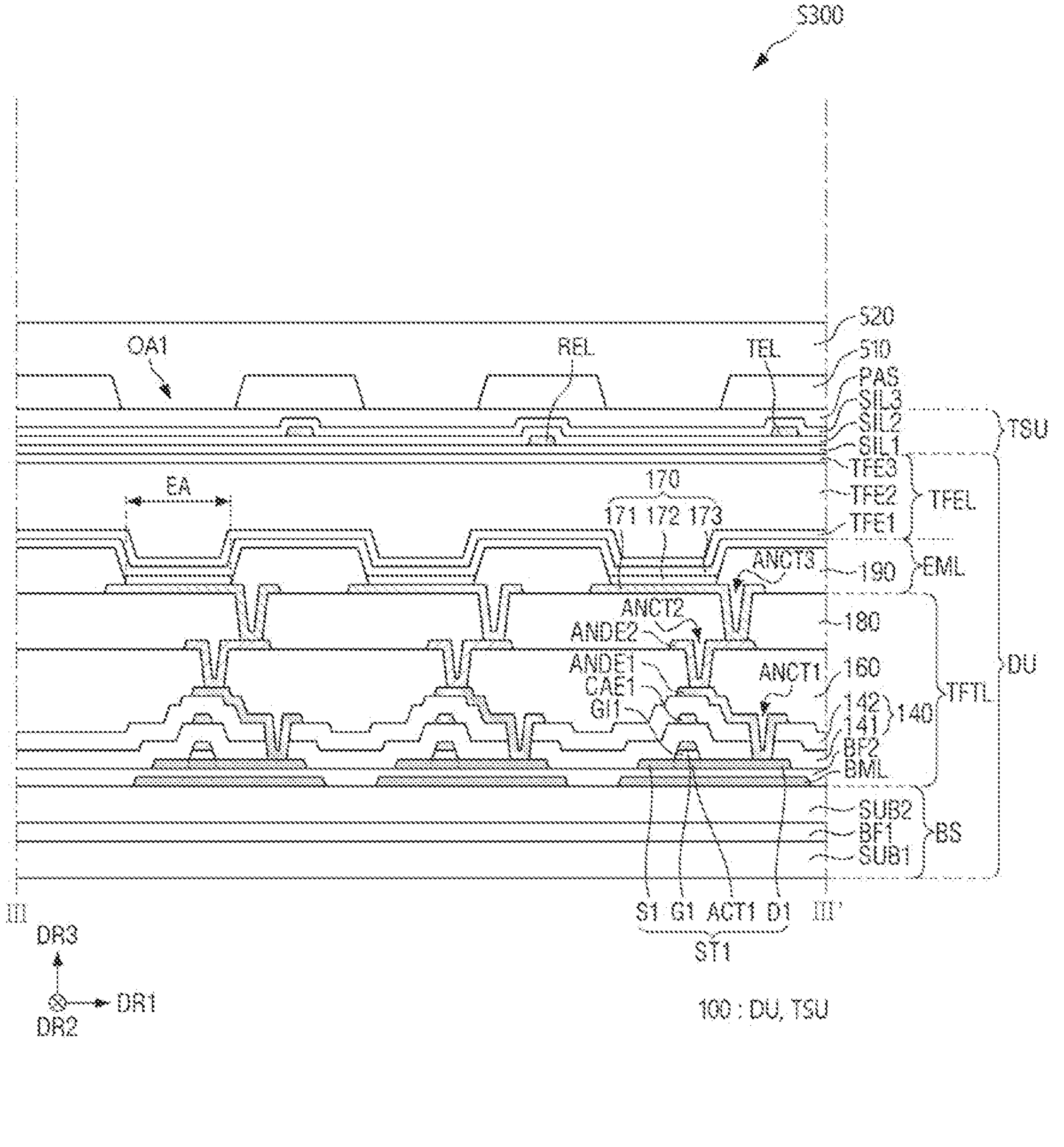
FIG. 21 is a cross-sectional view showing step S300 of FIG. 16 taken along line III-III' of FIG. 7 according to embodiments of the present disclosure.
Figure 22:
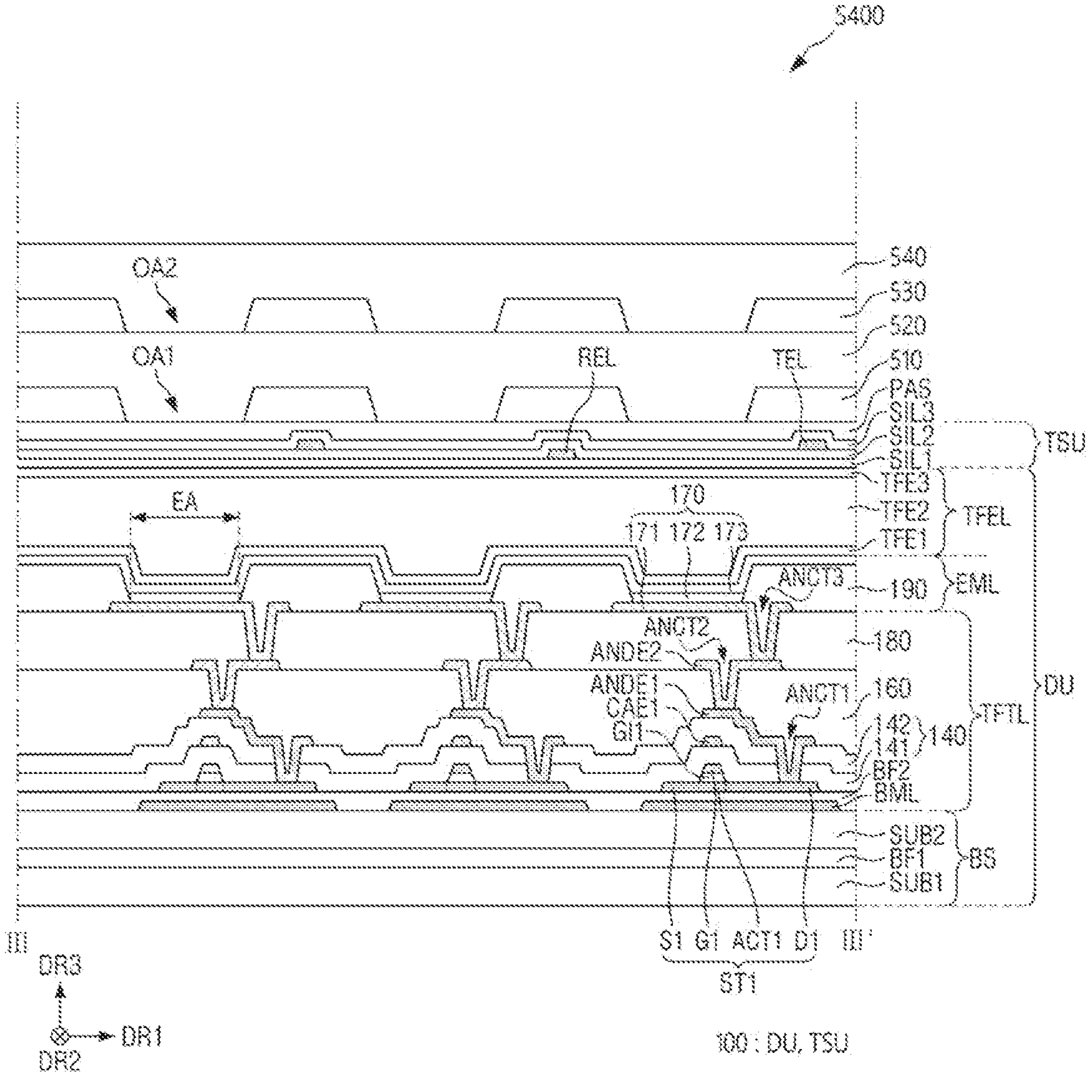
FIG. 22 is a cross-sectional view showing step S400 of FIG. 16 taken along line III-III' of FIG. 7 according to embodiments of the present disclosure.
Figure 23:
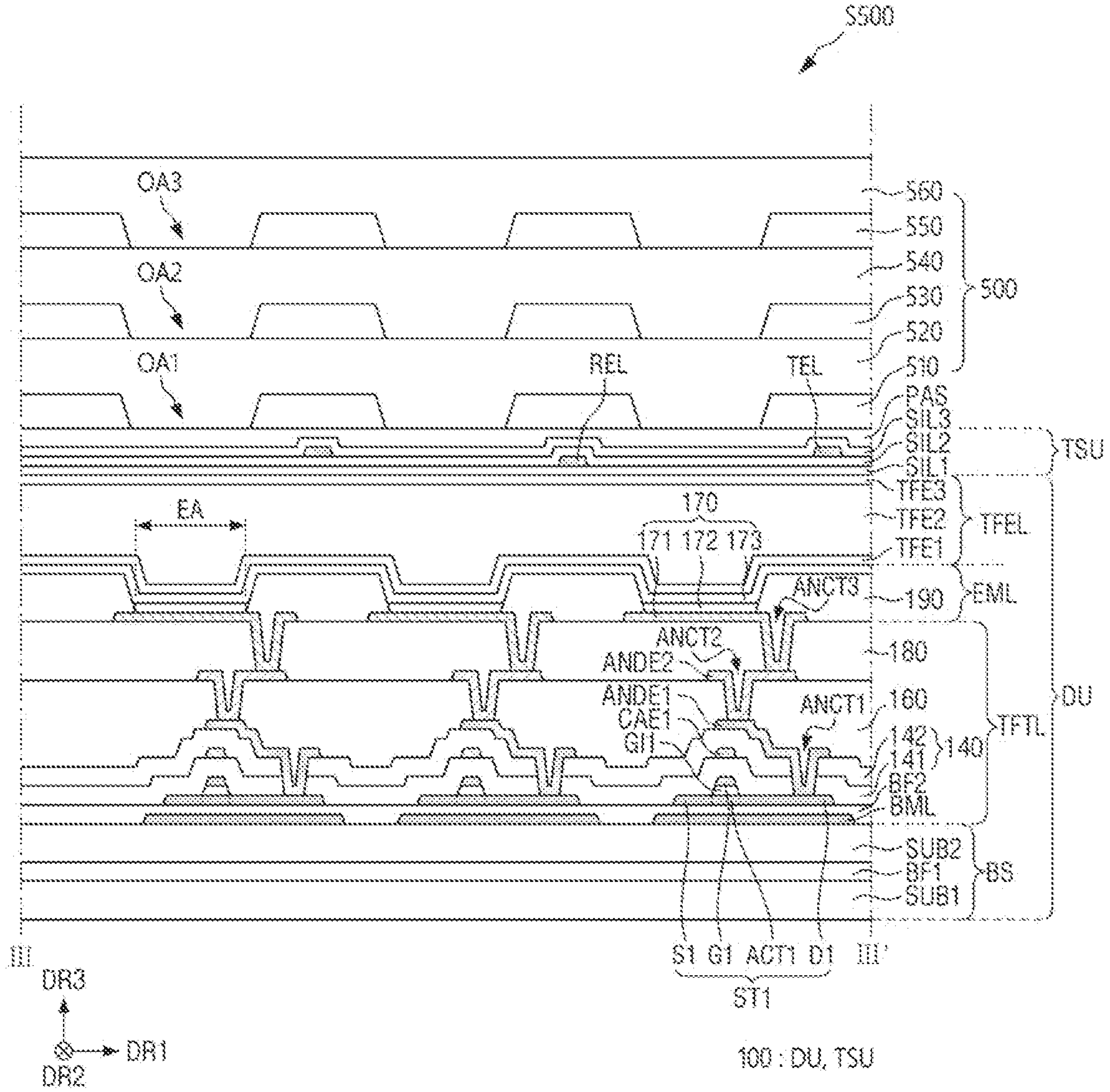
FIG. 23 is a cross-sectional view showing step S500 of FIG. 16 taken along line III-III' of FIG. 7 according to embodiments of the present disclosure.

FIG. 16 is a flowchart showing a method for manufacturing a display device according to an embodiment. FIGS. 17 to 19 are cross-sectional views showing step S100 of FIG. 16. FIG. 20 is a cross-sectional view showing step S200 of FIG. 16. FIG. 21 is a cross-sectional view showing step S300 of FIG. 16. FIG. 22 is a cross-sectional view showing step S400 of FIG. 16. FIG. 23 is a cross-sectional view showing step S500 of FIG. 16.

Referring to FIGS. 16 to 23, a manufacturing method S1 of a display device according to an embodiment may include forming a thin film encapsulation layer in step S100, forming a touch sensor layer in step S200, forming a first light blocking layer and a first light transmitting layer in step S300, forming a second light blocking layer and a second light transmitting layer in step S400, and forming a third light blocking layer and a third light transmitting layer in step S500.

Firstly, in the step S100 of forming the thin film encapsulation layer, the first encapsulation film TFE1 may be formed on the light emitting element layer EML. In an embodiment, the first encapsulation film TFE1 may be formed may be formed through a thin film deposition process such as physical vapor deposition (PVD), chemical vapor deposition (CVD), plasma enhanced CVD (PECVD), or atomic layer deposition (ALD). The first encapsulation film TFE1 may be formed as a single layer or a multilayer in which one or more inorganic layers of a silicon nitride layer, a silicon oxynitride layer, a silicon oxide layer, a titanium oxide layer and an aluminum oxide layer are alternately stacked.

Next, the second encapsulation film TFE2 may be formed on the first encapsulation film TFE1. The second encapsulation film TFE2 may be an organic layer of a single layer or multiple layers. In an embodiment, the second encapsulation film TFE2 may include a polymer-based material. Polymer-based materials may include polyethylene terephthalate, polyethylene naphthalate, polycarbonate, polyimide, polyethylene sulfonate, polyoxymethylene, polyarylate, hexamethyldisiloxane, and acrylic resins (e.g., polymethyl methacrylate, polyacrylic acid, or the like), or any combination thereof.

In an embodiment, the second encapsulation film TFE2 may be formed by applying a monomer having flowability and then curing the monomer layer by using heat or ultraviolet rays. However, embodiments of the present disclosure are not necessarily limited thereto. For example, in an embodiment, formation may be performed by directly applying the polymer-based material.

Next, the third encapsulation film TFE3 may be formed on the light emitting element layer EML. In an embodiment, the third encapsulation film TFE3 may be formed through the same process as the first encapsulation film TFE1. The third encapsulation film TFE3 may be formed of the same material as the first encapsulation film TFE1.

Secondly, in the step S200 of forming the touch sensor layer, the first touch insulating layer SIL1 may be formed on the thin film encapsulation layer TFE1, the first touch electrode REL may be formed on the first touch insulating layer SIL1, the second touch insulating layer SIL2 may be formed on the first touch electrode REL, the second touch electrode TEL may be formed on the second touch insulating layer SIL2, the third touch insulating layer SIL3 may be formed on the second touch electrode TEL, and the planarization layer PAS may be formed on the third touch insulating layer SIL3.

The first touch insulating layer SIL1, the second touch insulating layer SIL2, and the third touch insulating layer SIL3 may include at least one inorganic layer. For example, in an embodiment each of the first touch insulating layer SIL1, the second touch insulating layer SIL2, and the third touch insulating layer SIL3 may be an inorganic layer containing at least one of a silicon nitride layer, a silicon oxynitride layer, a silicon oxide layer, a titanium oxide layer, or an aluminum oxide layer. However, embodiments of the present disclosure are not necessarily limited thereto.

For example, in an embodiment, the first touch insulating layer SIL1, the second touch insulating layer SIL2, and the third touch insulating layer SIL3 may be organic layers. In an embodiment, each of the first touch insulating layer SIL1, the second touch insulating layer SIL2, and the third touch insulating layer SIL3 may be an organic layer such as acryl resin, epoxy resin, phenolic resin, polyamide resin, polyimide resin, or the like. However, embodiments of the present disclosure are not necessarily limited thereto.

In an embodiment in which the first touch insulating layer SIL1, the second touch insulating layer SIL2, and the third touch insulating layer SIL3 are inorganic layers, the first touch insulating layer SIL1, the second touch insulating layer SIL2, and the third touch insulating layer SIL2 Insulation layer SIL3 may be formed may be formed through a thin film deposition process such as physical vapor deposition (PVD), chemical vapor deposition (CVD), plasma enhanced CVD (PECVD), or atomic layer deposition (ALD).

In an embodiment in which the first touch insulating layer SIL1, the second touch insulating layer SIL2, and the third touch insulating layer SIL3 are organic layers, the first touch insulating layer SIL1, the second touch insulating layer SIL2, and the third touch insulating layer SIL3 may be formed by curing a monomer by using heat or ultraviolet rays. However, embodiments of the present disclosure are not necessarily limited thereto. For example, in an embodiment, the first touch insulating layer SIL1, the second touch insulating layer SIL2, and the third touch insulating layer SIL3 may be formed by directly applying a polymer-based material.

In an embodiment, the first touch electrode REL and the second touch electrode TEL may be formed as a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO. The first touch electrode REL and the second touch electrode TEL may be formed by patterning the metal material through a photolithography process.

In an embodiment, the planarization layer PAS may be formed of an organic layer such as acryl resin, epoxy resin, phenolic resin, polyamide resin, polyimide resin and the like. The planarization layer PAS may be formed by curing a monomer by using heat or ultraviolet rays. However, embodiments of the present disclosure are not necessarily limited thereto. For example, in an embodiment, the planarization layer PAS may be formed by directly applying a polymer-based material.

Thirdly, in the step S300 of forming the first light blocking layer and the first light transmitting layer, the first light blocking layer 510 may be formed on the touch sensor layer TSU, and the first light transmitting layer 520 may be formed on the first light blocking layer 510.

The first light blocking layer 510 may include a light blocking organic material. For example, in an embodiment the first light blocking layer 510 is a light blocking material capable of absorbing or blocking light, and may include carbon black, organic black pigment, blue pigment, blue dye, green pigment, and/or green dye. Further, the first light blocking layer 510 may include an organic material such as acryl resin, epoxy resin, phenolic resin, polyamide resin, polyimide resin, or the like. In an embodiment, for adjusting the refractive index, the first light blocking layer 510 may include an epoxy-based resin and/or an acryl-based resin containing fluorine (F), or may further include silicon dioxide ($SiO_2$) and/or hollow silica.

In an embodiment the first light transmitting layer 520 may be an organic layer including a transparent organic material capable of transmitting light. For example, the first light transmitting layer 520 may include an organic layer such as acryl resin, epoxy resin, phenolic resin, polyamide resin, polyimide resin and the like. However, embodiments of the present disclosure are not necessarily limited thereto. For example, in an embodiment, the first light transmitting layer 520 may be an inorganic layer capable of transmitting light. For example, the first light transmitting layer 520 may include a silicon nitride layer, a silicon oxynitride layer, a silicon oxide layer, a titanium oxide layer, or an aluminum oxide layer. In an embodiment in which the first light transmitting layer 520 is an organic layer, nanoparticles such as zirconium oxide (ZrOx) and titanium oxide (TiOx) may be included to increase the refractive index.

In an embodiment, the first light blocking layer 510 and the first light transmitting layer 520 may be formed by curing a monomer by using heat or ultraviolet rays. However, embodiments of the present disclosure are not necessarily limited thereto. For example, in an embodiment, the first light blocking layer 510 and the first light transmitting layer 520 may be formed by directly applying a polymer-based material.

In the step S400 of forming the second light blocking layer and the second light transmitting layer, the second light blocking layer 530 may be formed on the first light transmitting layer 520 (e.g., formed directly thereon), and the second light transmitting layer 540 may be formed on the second light blocking layer 530 (e.g., formed directly thereon).

The second light blocking layer 530 may include a material that blocks or absorbs light. In an embodiment, the second light blocking layer 530 may include a light blocking organic material. For example, the second light blocking layer 530 may include the same material as the first light blocking layer 510 described above. In an embodiment, for adjusting the refractive index, the second light blocking layer 530 may include an epoxy-based resin and/or an acryl-based resin containing fluorine (F), or may include silicon dioxide ($SiO_2$) and/or hollow silica.

In an embodiment, the second light transmitting layer 540 may be an organic layer including a transparent organic material capable of transmitting light. For example, in an embodiment the second light transmitting layer 540 may include the same organic material as the first light transmitting layer 520 described above.

In an embodiment, the second light blocking layer 530 and the second light transmitting layer 540 may be formed by curing a monomer by using heat or ultraviolet rays. However, embodiments of the present disclosure are not necessarily limited thereto. For example, in an embodiment the second light blocking layer 530 and the second light transmitting layer 540 may be formed by directly applying a polymer-based material.

In an embodiment, in the step S500 of forming the third light blocking layer and the third light transmitting layer, the third light blocking layer 550 may be formed on the second light transmitting layer 540 (e.g., formed directly thereon), and the third light transmitting layer 560 may be formed on the third light blocking layer 550 (e.g., formed directly thereon).

The third light blocking layer 550 may include a material that blocks or absorbs light. In an embodiment, the third light blocking layer 550 may include a light blocking organic material. For example, in an embodiment the third light blocking layer 550 may include the same material as the first light blocking layer 510 described above. In an embodiment, for adjusting the refractive index, the third light blocking layer 550 may include an epoxy-based resin and/or an acryl-based resin containing fluorine (F), or may include silicon dioxide ($SiO_2$) and/or hollow silica.

In an embodiment, the third light transmitting layer 560 may be an organic layer including a transparent organic material capable of transmitting light. For example, the third light transmitting layer 560 may include the same organic material as the first light transmitting layer 520 described above.

In an embodiment, the third light blocking layer 550 and the third light transmitting layer 560 may be formed by curing a monomer by using beat or ultraviolet rays. However, embodiments of the present disclosure are not necessarily limited thereto. For example, in an embodiment, the third light blocking layer 550 and the third light transmitting layer 560 may be formed by directly applying a polymer-based material.

According to the manufacturing method S1 of the display device according to an embodiment of the present disclosure, the first touch insulating layer SIL1, the second touch insulating layer SIL2, the third touch insulating layer SIL3, the planarization layer PAS, the first light transmitting layer 520, the second light transmitting layer 540, and the third light transmitting layer 560 disposed on the thin film encapsulation layer TFE1 are formed of an inorganic layer having a high refractive index or a high-refractive organic layer, so that the viewing angle may be minimized, and at the same time, it is possible to increase the light emission efficiency in the third direction DR3 that is the front (e.g., top surface in the drawing) direction.

In concluding the detailed description, those skilled in the art will appreciate that many variations and modifications can be made to the described embodiments without substantially departing from the principles of the present disclosure. Therefore, the described embodiments of the present disclosure are used in a generic and descriptive sense only and not for purposes of limitation.

What is claimed is:

1. A display device comprising:

a substrate;

a light emitting element layer disposed on the substrate, the light emitting element layer comprising a plurality of emission areas, each of the plurality of emission areas comprises a light emitting element that emits light;

a thin film encapsulation layer disposed on the light emitting element layer, the thin film encapsulation layer comprising a first inorganic encapsulation film, a first organic encapsulation film disposed on the first inorganic encapsulation film, and a second inorganic encapsulation film disposed on the first organic encapsulation film; and a light control layer comprising a first light blocking layer disposed on the thin film encapsulation layer and having a first opening, and a first light transmitting layer disposed on the first light blocking layer, wherein an entirety of the light control layer is disposed farther from an upper surface of the substrate than an upper surface of the thin film encapsulation layer is disposed from the upper surface of the substrate, wherein the first light transmitting layer includes an organic layer, and a refractive index of the first light transmitting layer is greater than a refractive index of the first organic encapsulation film.

2. The display device of claim 1, wherein:

the first light blocking layer contains an organic material that blocks light; and a refractive index of the first light blocking layer is less than the refractive index of the first light transmitting layer.

3. The display device of claim 2, wherein a difference between the refractive index of the first light transmitting layer and the refractive index of the first light blocking layer is in a range of 0.1 to 0.15.

4. The display device of claim 3, wherein:

the refractive index of the first light blocking layer is in a range of 1.4 to 1.55; and the refractive index of the first light transmitting layer is in a range of 1.55 to 1.7.

5. The display device of claim 2, wherein the refractive index of the first light blocking layer is greater than the refractive index of the first organic encapsulation film.

6. The display device of claim 1, wherein:

the light control layer further comprises:

a second light blocking layer disposed on the first light transmitting layer, the second light blocking layer having a second opening; and a second light transmitting layer disposed on the second light blocking layer, and wherein the second light transmitting layer includes an organic layer, and wherein a refractive index of the second light transmitting layer is greater than the refractive index of the first organic encapsulation film.

7. The display device of claim 6, wherein the second opening overlaps the first opening in a thickness direction of the substrate.

8. The display device of claim 6, wherein a width of the first opening is greater than a width of the second opening.

9. The display device of claim 6, wherein a width of the first opening is less than a width of the second opening.

10. The display device of claim 6, wherein a thickness of the first light transmitting layer is different from a thickness of the second light transmitting layer.

11. The display device of claim 1, further comprising a touch sensor layer disposed between the thin film encapsulation layer and the light control layer, wherein the touch sensor layer comprises:

a first touch insulating layer;

a touch electrode disposed on the first touch insulating layer; and a second touch insulating layer disposed on the touch electrode, wherein refractive indices of the first touch insulating layer and the second touch insulating layer are greater than the refractive index of the first organic encapsulation film.

12. The display device of claim 11, wherein:

the first touch insulating layer and the second touch insulating layer include an organic layer; and refractive indices of the first touch insulating layer and the second touch insulating layer are greater than or equal to a refractive index of the second inorganic encapsulation film.

13. The display device of claim 12, wherein:

the touch sensor layer further comprises a planarization layer disposed on the second touch insulating layer; and the planarization layer has a same refractive index as the refractive index of the second touch insulating layer.

14. The display device of claim 13, wherein the first touch insulating layer, the second touch insulating layer, the planarization layer, and the first light transmitting layer have a same refractive index as each other.

15. The display device of claim 11, wherein the first touch insulating layer and the second touch insulating layer include an inorganic layer.

16. The display device of claim 1, wherein an angle between a sidewall of the first opening and a horizontal direction within the first opening is in a range of about 90 degrees to about 110 degrees.

17. The display device of claim 1, wherein the first opening overlaps an emission area of the plurality of emission areas in a thickness direction of the substrate.

18. An electronic device comprising:

a display device, comprising:

a substrate;

a light emitting element layer disposed on the substrate, the light emitting element layer comprising a plurality of emission areas, each of the plurality of emission areas comprises a light emitting element emitting light;

a thin film encapsulation layer disposed on the light emitting element layer, the thin film encapsulation layer comprising a first inorganic encapsulation film, a first organic encapsulation film disposed on the first inorganic encapsulation film, and a second inorganic encapsulation film disposed on the first organic encapsulation film; and a light control layer comprising a first light blocking layer disposed on the thin film encapsulation layer and having a first opening, and a first light transmitting layer disposed on the first light blocking layer, wherein an entirety of the light control layer is disposed farther from an upper surface of the substrate than an upper surface of the thin film encapsulation layer is disposed from the upper surface of the substrate, wherein a refractive index of the first light transmitting layer is greater than or equal to a refractive index of the second inorganic encapsulation film.

19. The electronic device of claim 18, wherein the light control layer further comprises:

a second light blocking layer disposed on the first light transmitting layer, the second light blocking layer having a second opening; and a second light transmitting layer disposed on the second light blocking layer, wherein a refractive index of the second light transmitting layer is greater than or equal to the refractive index of the second inorganic encapsulation film.

20. The display electronic device of claim 19, further comprising a touch sensor layer disposed between the thin film encapsulation layer and the light control layer, wherein the touch sensor layer comprises:

a first touch insulating layer;

a touch electrode disposed on the first touch insulating layer; and a second touch insulating layer disposed on the touch electrode, wherein refractive indices of the first touch insulating layer and the second touch insulating layer are greater than or equal to the refractive index of the second inorganic encapsulation film.

* * * * *